United States Patent
Zorabedian et al.

(10) Patent No.: US 6,282,215 B1
(45) Date of Patent: Aug. 28, 2001

(54) CONTINUOUSLY-TUNABLE EXTERNAL CAVITY LASER

(75) Inventors: Paul Zorabedian, Mountain View; William B. Chapman, Sunnyvale; Michael Y. Jenq, Saratoga, all of CA (US)

(73) Assignee: New Focus, Inc., San Jose, CA (US)

( * ) Notice: Subject to any disclaimer, the term of this patent is extended or adjusted under 35 U.S.C. 154(b) by 0 days.

(21) Appl. No.: 09/418,950

(22) Filed: Oct. 15, 1999

Related U.S. Application Data

(63) Continuation-in-part of application No. 09/342,342, filed on Jun. 29, 1999, now Pat. No. 6,108,355.
(60) Provisional application No. 60/104,448, filed on Oct. 16, 1998, and provisional application No. 60/120,780, filed on Feb. 19, 1999.

(51) Int. Cl.[7] .................................................. H01S 3/10
(52) U.S. Cl. ............................ 372/20; 372/32; 372/19; 372/28; 372/99; 372/102; 372/38
(58) Field of Search .................................. 372/20, 38, 98, 372/99, 19, 32, 102

(56) References Cited

U.S. PATENT DOCUMENTS 6,108,355 * 8/2000 Zorabedian .......................... 372/20
6,205,159    3/2001 Sesko et al. ........................ 372/20

* cited by examiner

*Primary Examiner*—Leon Scott, Jr.
(74) *Attorney, Agent, or Firm*—Cary & Kelly, LLP; Charles C. Cary

(57) ABSTRACT

The present invention provides a continuously-tunable external cavity laser (ECL) with a compact form factor and precise tuning. A novel interference filter which may be used to tune the ECL provides an absence of mode-hopping and reduced feedback from both spurious interference and reflections in the external cavity. A novel tuning mechanism is disclosed which provides for mechanical FM tuning of a wide range ECL tuning elements such as: an interference filter, a diffraction element, and a retroreflector. A novel feedback circuit is disclosed which provides closed loop feedback for selecting output wavelength in a laser.

35 Claims, 14 Drawing Sheets

| Wavelength [nm] | Position |
|---|---|
| 1525.0 | 0 |
| 1525.5 | 3 |
| 1526.0 | 6 |

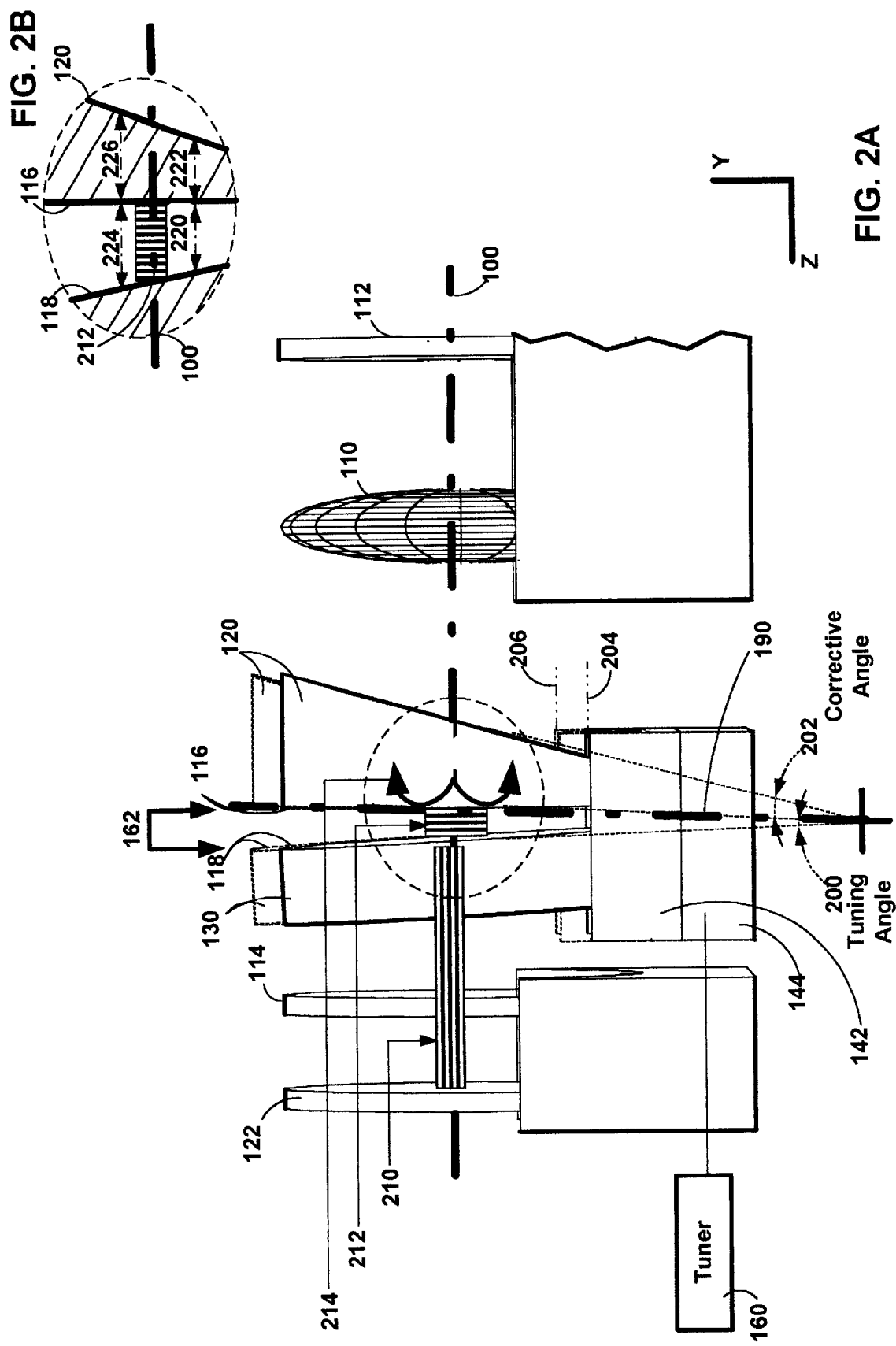

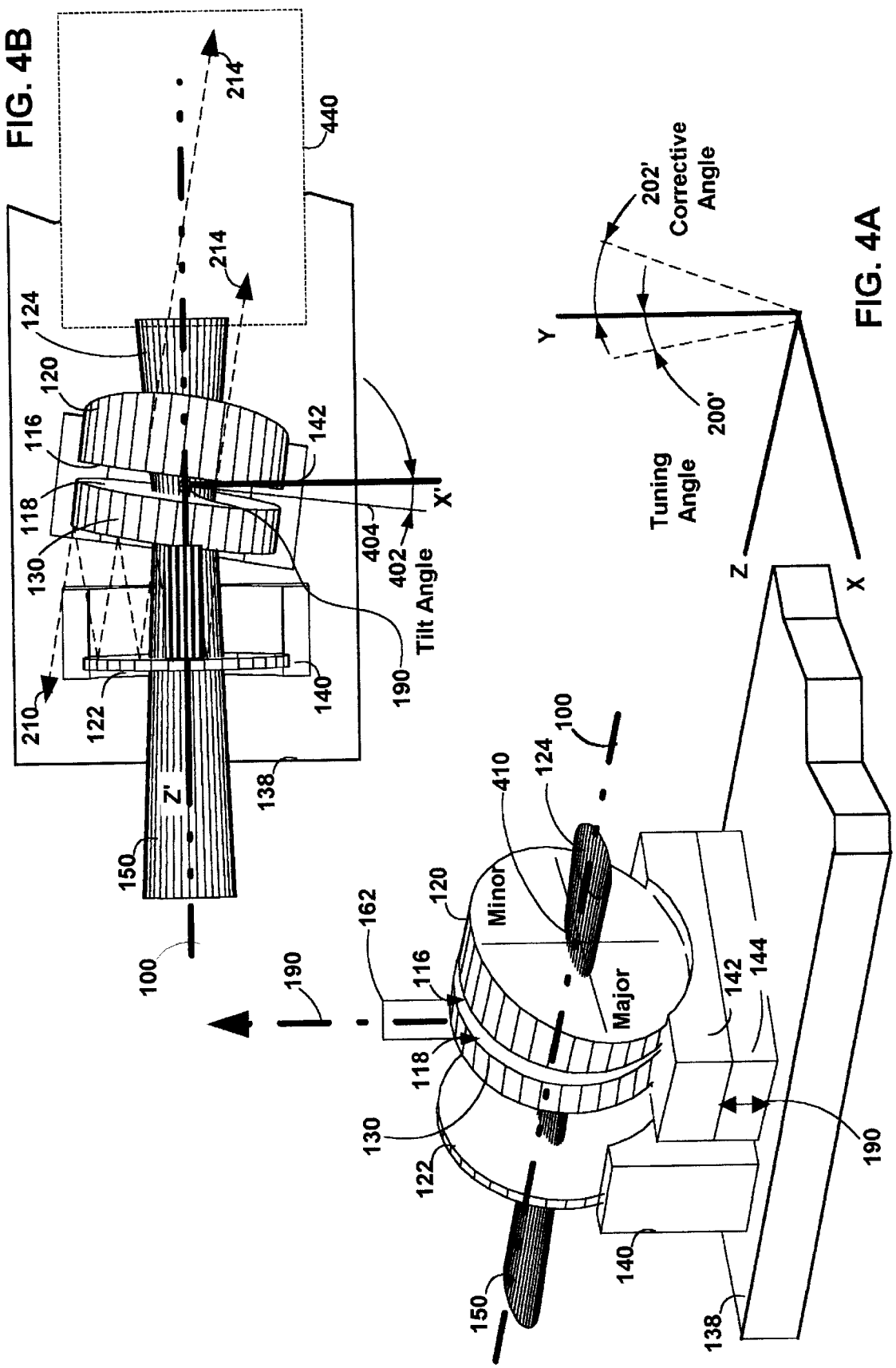

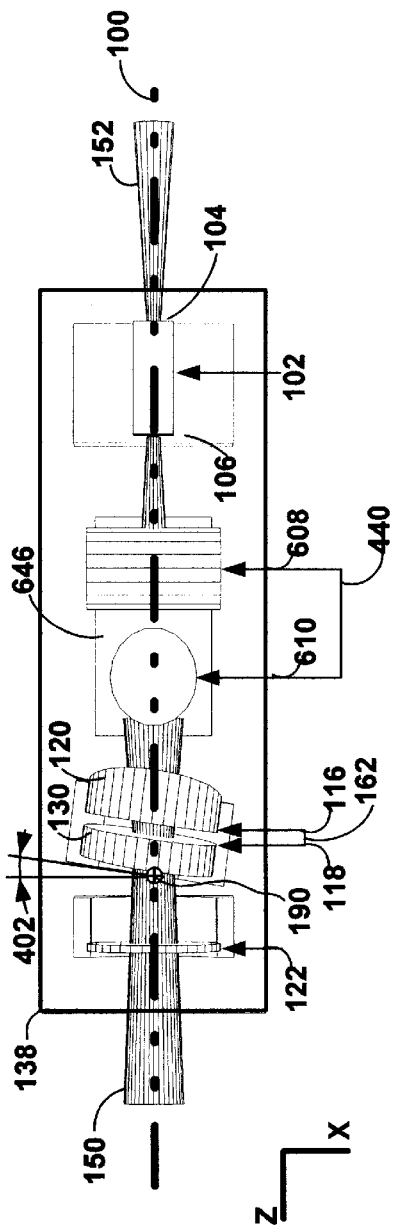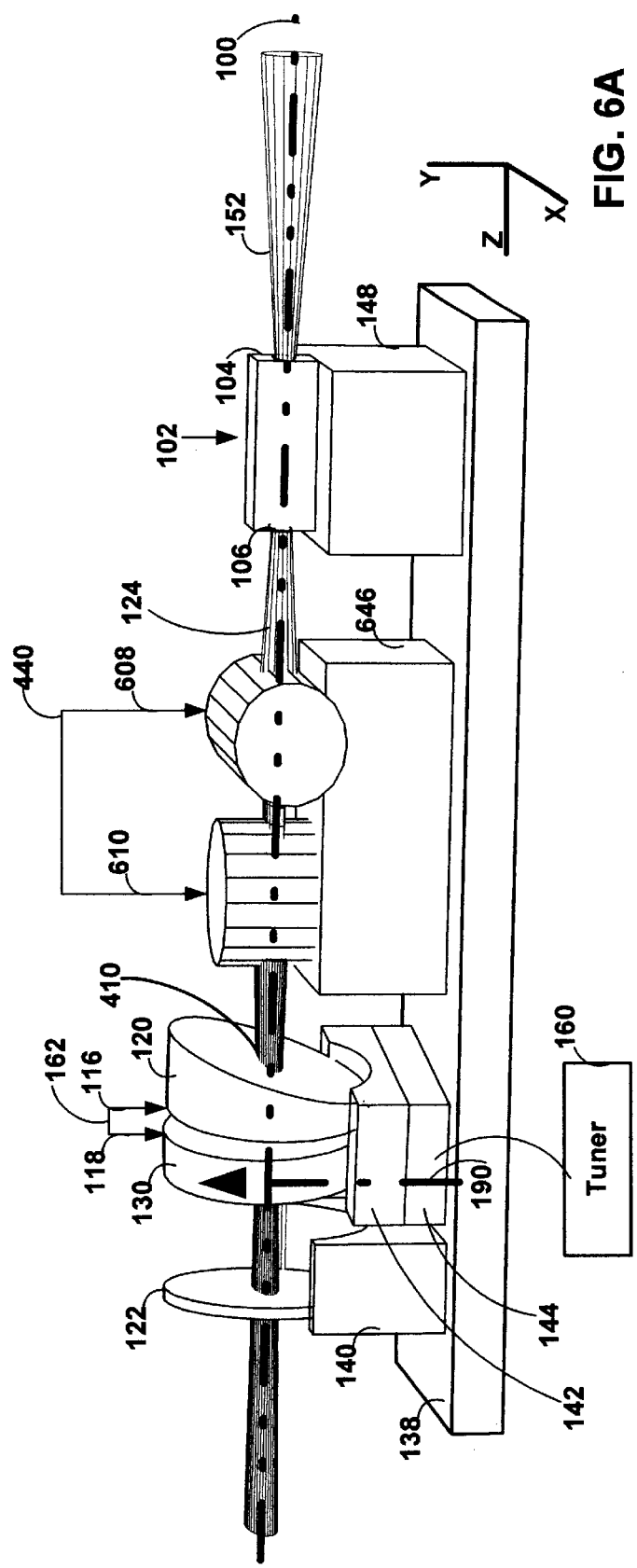

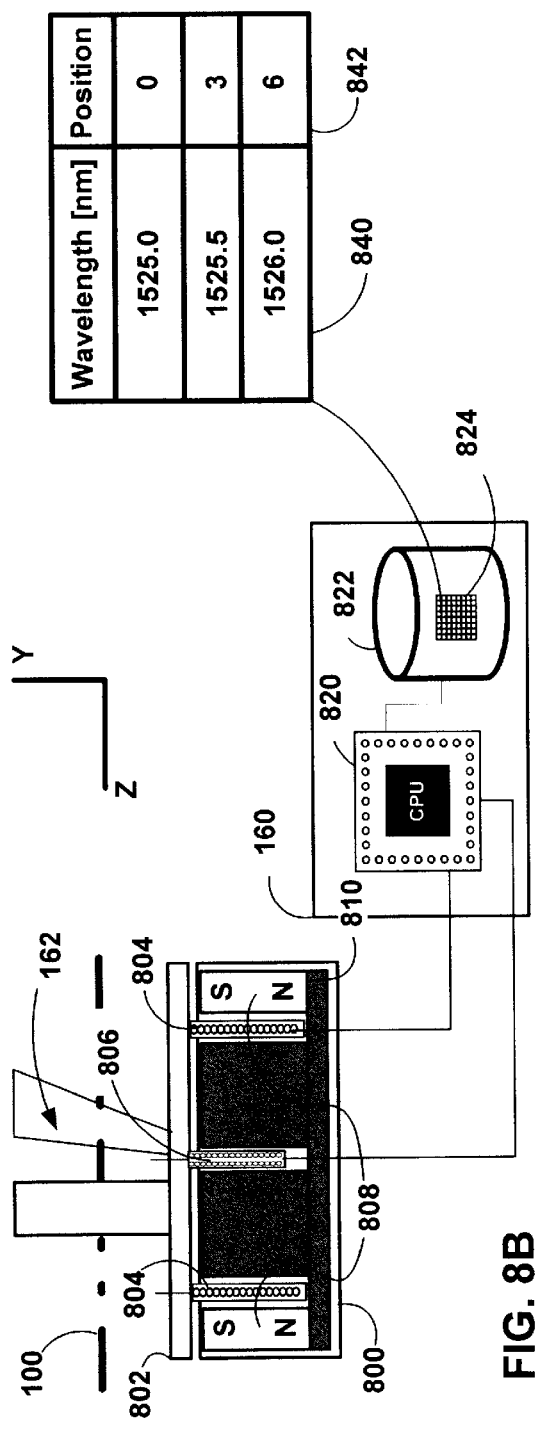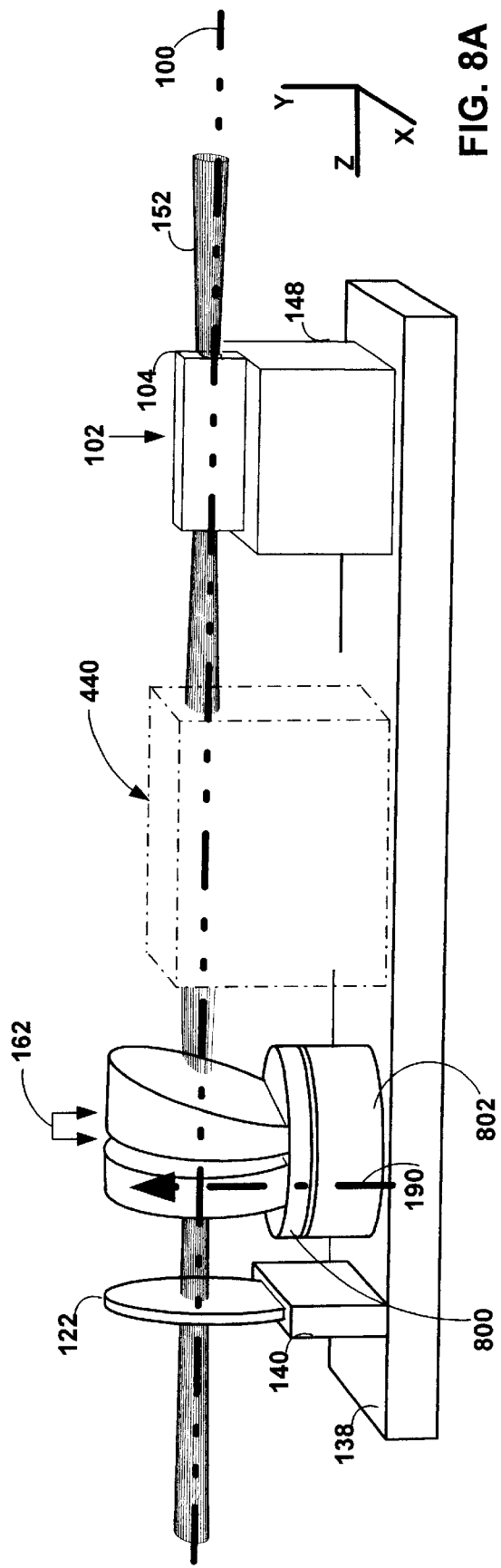
FIG. 8B
FIG. 8A

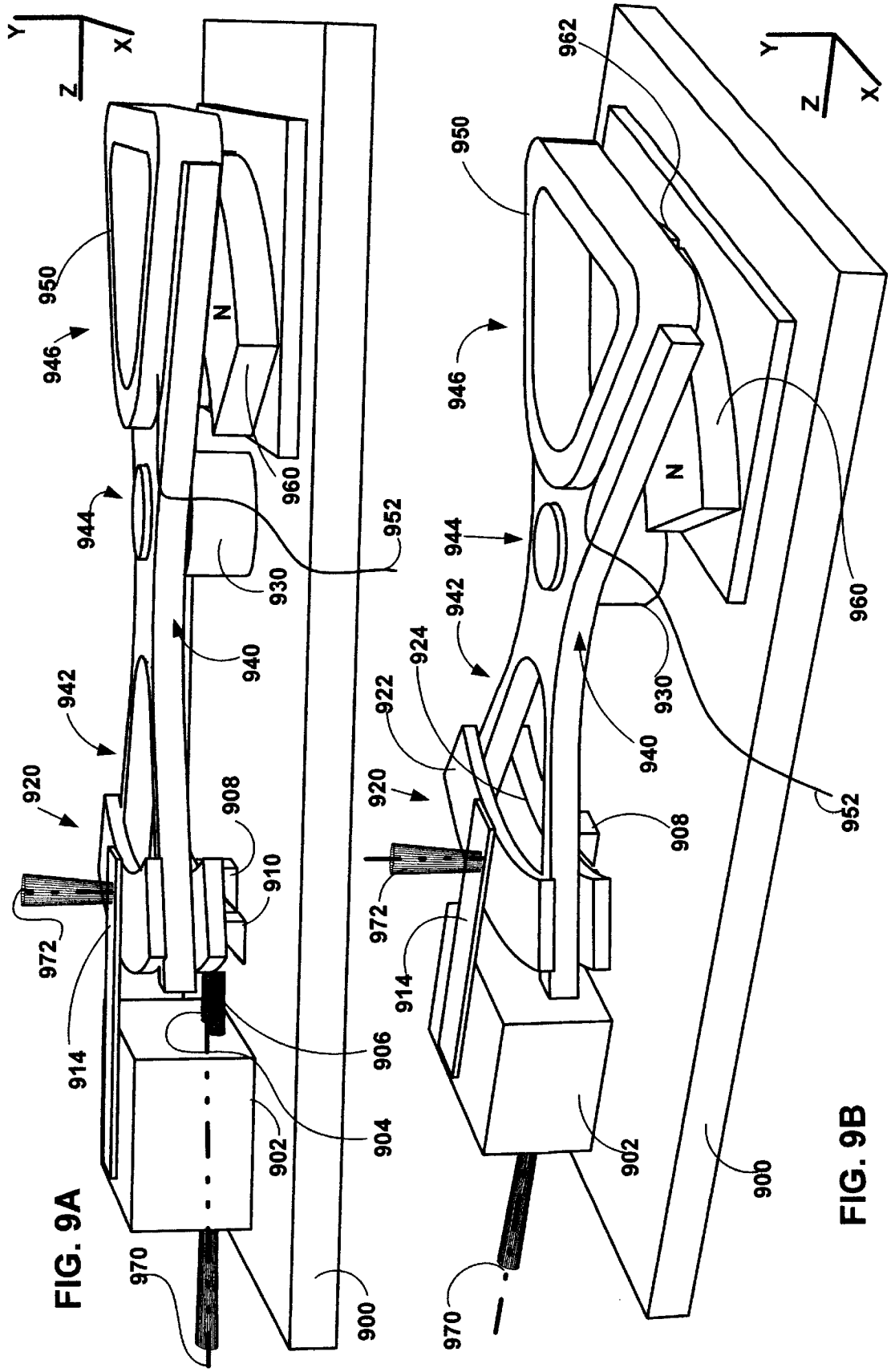

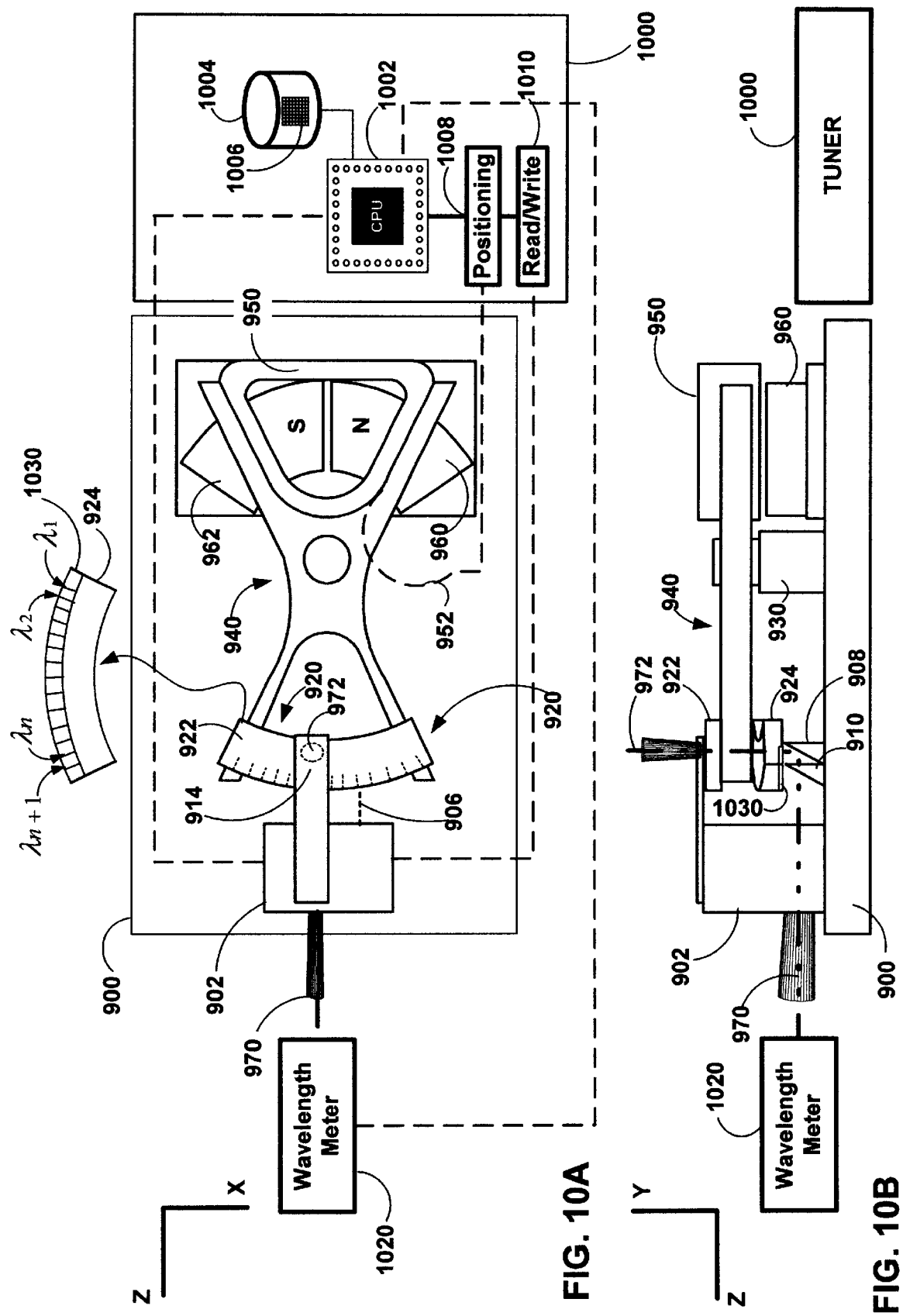

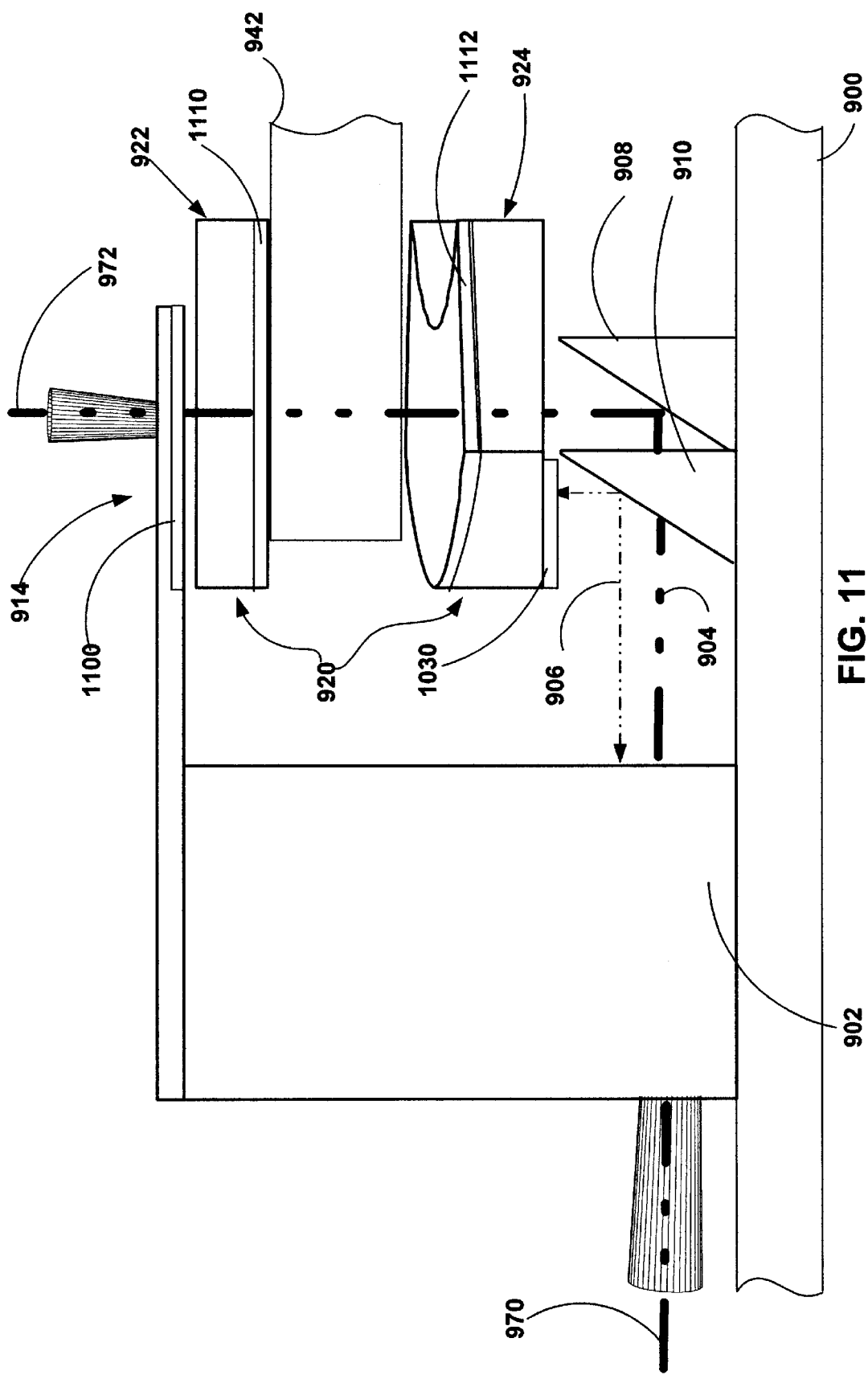

CONTINUOUSLY-TUNABLE EXTERNAL CAVITY LASER

CROSS REFERENCE TO RELATED APPLICATION

This application is a continuation-in-part of U.S. application Ser. No. 09/342,342 now U.S. Pat. No. 6,108,355 filed Jun. 29, 1999 entitled "CONTINUOUSLY TUNABLE EXTERNAL CAVITY LASER" by inventor Paul Zorabedian, and claims the benefit of prior filed U.S. Provisional Application Nos. 60/104,448 filed on Oct. 16, 1998 and 60/120,780 filed on Feb. 19, 1999.

Each of the above-cited applications is incorporated herein by reference in its entirety.

BACKGROUND OF THE INVENTION

Copyright Authorization

A portion of the disclosure of this patent document contains material which is subject to copyright protection. The copyright owner has no objection to the facsimile reproduction by anyone of the patent disclosure, as it appears in the U.S. Patent and Trademark Office patent files or records, but otherwise reserves all copyright rights whatsoever.

1. Field of Invention

The field of the present invention relates in general to tunable external cavity lasers, and particularly to an improved tuning system which suppresses mode-hopping and reduces unwanted feedback.

2. Description of the Related Art

Tunable external cavity diode lasers (ECDLs) are widely used in lightwave test-and-measurement equipment and are becoming recognized as essential components for the rapidly expanding fields of wavelength division multiplexed (WDM) optical voice and data communications. The many applications within these fields represent many different sets of performance specifications. However, the following requirements are typical: small size of the optomechanical assembly; phase-continuous tuning of the wavelength; servo control of the wavelength; controllable frequency modulation (FM) at audio rates (e.g., 100 Hz to 10 kHz) in order to broaden the linewidth; and ability to generate highly linear wavelength sweeps.

Commercial ECDLs come in a variety of tunable configurations. Generally, either a retroreflector, a diffraction element, or an interference element is utilized for controlling the feedback wavelength to the gain medium and thus the output wavelength of the laser. In a first of these tunable configurations, e.g., a "Littman" configuration, tuning is accomplished by motion of either a diffraction grating or a retroreflector positioned on an actuated pivot arm. The arm, which is rather long and massive, is required to provide phase-continuous tuning. The arm is driven by either a rotary stepper motor or a rotary DC motor. The stepper motor solution provides long-range travel and built-in position encoding, but its bandwidth is too low for FM and its discrete nature is unsuitable for linear FM sweeping. The DC motor can generate linear sweeps provided it has sufficient torque, but it cannot be used for FM. In a second configuration, the tuning is accomplished by an interference-filter which is rotated with respect to the optical path. A laser with this second configuration is described in the article by Dr. P. Zorabedian et al. entitled: *"Interference-filter-tuned, alignment-stabilized, semiconductor external-cavity laser"*, 13 Optics Letters pp. 826–828 (1988). This laser configuration as well relies on actuators, such as stepper motors, which are not suitable for FM modulation. In both the first and second configuration, FM modulation is typically performed by modulating the injection current to the semiconductor optical gain medium, which has the highly undesirable effect of introducing amplitude modulation (AM) on the laser's output.

What is needed is a new type of external cavity laser that has wide-range continuous tuning, possesses a compact, robust, inexpensive form factor, and is FM tunable.

SUMMARY OF THE INVENTION

The present invention provides a continuously-tunable external cavity laser (ECL) with a compact form factor and precise tuning. A novel interference filter which may be used to tune the ECL provides an absence of mode-hopping and reduced feedback from both spurious interference and reflections in the external cavity. A novel tuning mechanism is disclosed which provides for mechanical FM tuning of ECL tuning elements such as: an interference filter, a diffraction element, and a retroreflector. A novel feedback circuit is disclosed which provides closed loop feedback for selecting output wavelength in a laser.

In an embodiment of the invention, a tunable external cavity laser with a gain medium, a retroreflector, a first and a second reflector and a positioner is disclosed. The gain medium emits a beam. The retroreflector lies in a path of the beam. The first and second reflectors are positioned opposite one another and at an angle to one another in the path of the beam between the gain medium and the retroreflector to provide feedback of a selected wavelength to the gain medium to tune the laser. The positioner positions at least one of said first reflector and said second reflector to vary a separation between the reflectors along the path of the beam, thereby tuning the laser.

In an embodiment of the invention, a tunable external cavity laser with a gain medium, a tuning element and a voice coil actuator is disclosed. The gain medium emits a beam. The tuning element is moveably positioned in a path of the beam to provide feedback of a selected wavelength to the gain medium. The voice coil actuator couples to the tuning element and responds to an electrical signal to position the tuning element in the path of the beam to provide feedback of a selected wavelength to the gain medium to tune the tunable laser.

In an alternate embodiment of the invention, a tunable external cavity laser with a gain medium, a tuning element, an encoder, a reader, and a positioner is disclosed. The gain medium emits a beam. The tuning element is movably positioned in a path of the beam to provide feedback of a selected wavelength to the gain medium. The encoder records along a length thereof indicia corresponding to at least one of the positions of the tuning element and selected wavelengths of the beam. The reader reads the indicia. Either the encoder or the reader is coupled to the tuning element. The positioner is coupled to the tuning element to position the tuning element in the path of the beam to provide feedback of a selected wavelength to the gain medium to tune the tunable laser. The positioner positions the tuning element such that the data read by the reader substantially corresponds with the selected wavelength.

In an alternate embodiment of the invention a method for controlling the output wavelength of an external cavity laser is disclosed. The method for controlling the output wavelength comprises the acts of:

moving the tuning element to successive positions across a position range;

measuring a corresponding output wavelength at each of the successive positions across the position range responsive to said moving act;

recording indications of the corresponding output wavelengths along a length of an encoding medium coupled to a selected one of the base and the tuning element responsive to said measuring act;

reading from the non-selected one of the base and the tuning element the indications of the corresponding output wavelengths recorded on the encoding medium in said act of recording; and moving the tuning element to a selected position at which the indication of the corresponding output wavelength read in said act of reading corresponds with the selected wavelength.

BRIEF DESCRIPTION OF THE DRAWINGS

These and other features and advantages of the present invention will become more apparent to those skilled in the art from the following detailed description in conjunction with the appended drawings in which:

FIG. 2A is an exploded side view of the etalon and corrective elements shown in FIGS. 1A–B.

FIGS. 2B–E show alternate embodiments for the etalon and corrective elements shown in FIG. 2A.

FIGS. 4A–B are respectively isometric and top views of an alternate embodiment of the etalon and corrective elements in which both spurious interference and reflections are suppressed.

FIGS. 6A–B are respectively detailed isometric and top views of an external cavity diode laser incorporating another embodiment of a lens system suitable for use with the novel etalon and corrective elements shown in FIGS. 4A–B.

FIG. 8A is an isometric side view of an embodiment of the invention including a voice coil actuator for an interference filter-tuned external cavity diode laser.

FIG. 8B is a detailed cross-sectional elevation view of the voice coil actuator, position sensor, and control circuit for the tunable laser of FIG. 8A.

FIGS. 9A–B are isometric side views of an embodiment of an arcuate actuator for a tunable external cavity diode laser.

FIGS. 10A–B are top plan and side elevation views of the arcuately tuned external cavity diode laser of FIGS. 9A–B, including associated calibration and control circuitry.

FIG. 11 is a detailed side view of an embodiment of the resonant cavity portion of the tunable external cavity diode laser of FIGS. 9–10.

DETAILED DESCRIPTION OF THE EMBODIMENTS

The continuously-tunable external cavity laser (ECL) of the current invention provides the advantages of a compact form factor and precise tuning. A novel interference filter which may be used to tune the ECL provides an absence of mode-hopping and reduced feedback from both spurious interference and reflections in the external cavity. A novel tuning mechanism is disclosed which provides for mechanical FM tuning of tuning elements such as: an interference filter, a diffraction element, and a retroreflector. A novel feedback circuit is disclosed which provides closed loop feedback for selecting output wavelength.

In several embodiments of the invention, a "degenerate resonator" type of cavity configuration is utilized. This configuration is very tolerant to various angular and lateral misalignments to which the laser may be subjected. This property makes it easy to assemble and gives the laser robust tolerances to environmental fluctuations in transport, storage and service. The principles of degenerate resonators are well-known. In other embodiments of the invention a Littman configuration is shown.

FIGS. 1–2 and 4–7 are shown with reference to a three axis (X, Y, Z) coordinate system. The optical components of all embodiments, except that shown in FIGS. 7A–B, are laid out along an optical axis 100 which is itself parallel with the Z axis.

Figure 1B:
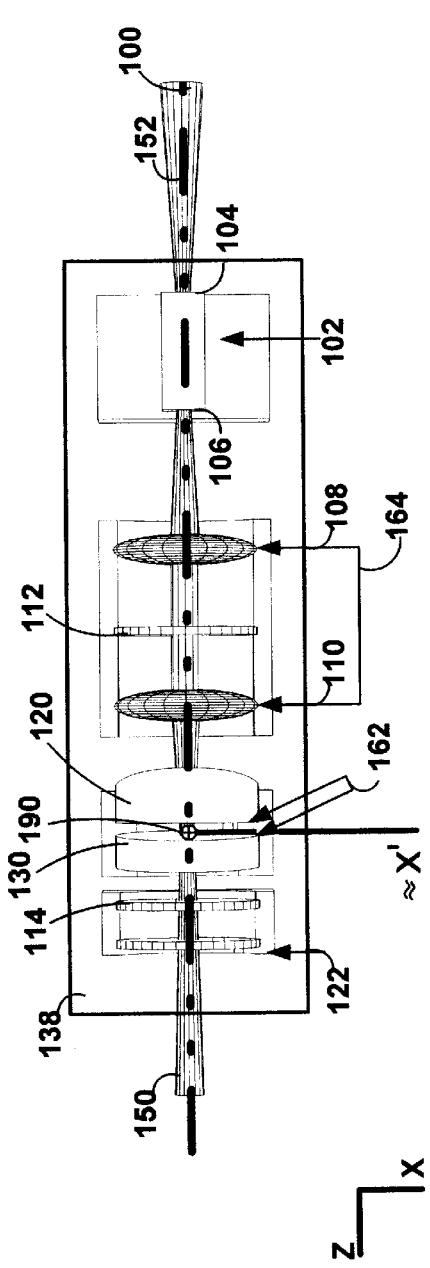
FIGS. 1A–B are respectively isometric and top views of a tunable external cavity laser according to the current invention.
Figure 1A:
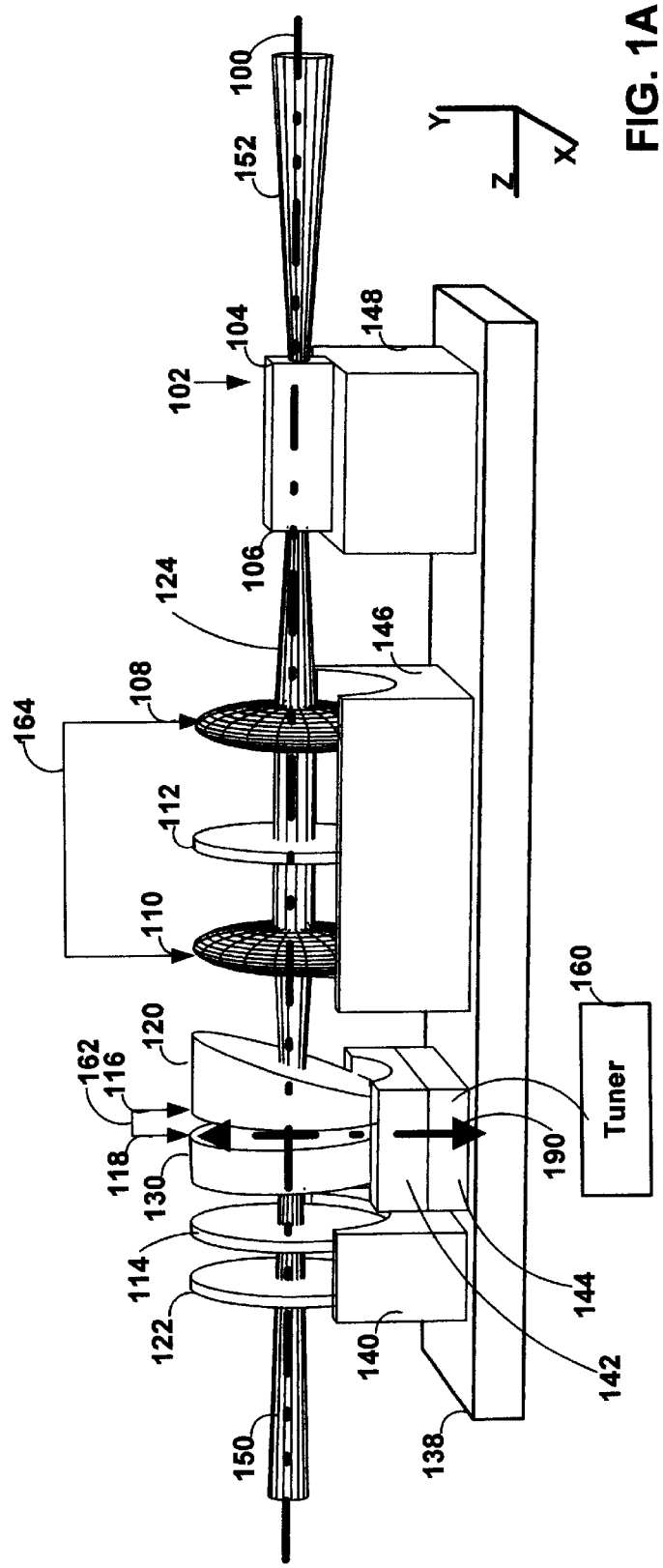

FIGS. 1A–B are respectively isometric and top views of an embodiment of the external cavity laser according to the current invention. The laser external cavity is delimited by the partially reflecting rear facet 104 of the gain medium/laser amplifier 102 and by an external retroreflector 122. Tunable feedback to control the lasing wavelength is provided by the external cavity which is optically coupled to the anti-reflection (AR) side of the gain medium. The effective reflectivity of the external cavity should be much greater than the residual reflectivity of the AR coated front facet 106 so that the tuning element, i.e., an interference filter/etalon, can deliver sufficient feedback to put the laser in the "strong feedback" regime.

The external cavity laser includes a laser amplifier 102, a lens system 164, quarter-wave plates/optical retarders 112–114, an interference filter/etalon 162, a corrective element 120, a translator 144, a tuner 160, a retroreflector 122, a base 138, and mounting blocks 140–142, 146–148. The laser amplifier 102, in the embodiment shown, is a laser diode with a rear and front facet 104–106, respectively. The lens system includes collimating/focusing lenses 108–110. The etalon includes first and second reflectors, 116–118.

Structurally, the tunable laser is shown laid out along a longitudinal axis 100. The laser amplifier, in an embodiment of the invention, is a conventional Fabry-Perot laser diode with a partially reflecting dielectric coating on the rear facet and an AR coating on the front facet. The front and rear facets 106–104 of the laser diode are aligned with longitudinal axis 100. The laser diode is coupled to the base 138 via mounting block 148. The proximal end of the external cavity is located at the front facet 106 of the laser diode. The distal end of the external cavity is defined by the retroreflector 122.

The retroreflector is affixed to the base via mount 140. The collimating/focusing lens pair 108–110 is mounted coaxially with the optical axis 100 proximate the front facet 106. These lenses collimate and focus ray 124 from the laser diode 102. The collimating and focusing lenses are affixed to the base 138 via mount 146. The quarter-wave plate/optical retarder 112 is positioned coaxially with and between the collimating and focusing lenses, it also is affixed to the base via mount 146. The second of the optical retarders 114 lies within the external cavity adjacent the distal end thereof and proximate to the retroreflector 122 and also is affixed to the base 138 via mounting block 140 which it shares with the retroreflector. The etalon 162 may be either gas-spaced or solid type. In the embodiment shown, the etalon is of a gas-spaced/air-gap type. The etalon defined by the opposing planar first and second reflectors 116–118 is a wedge-shaped air-gap. The reflectors are adhered to the inward facing surfaces of, respectively, a transmissive substrate 130 and the corrective element. In an embodiment of the invention, the reflectors may be formed by dielectrically coating the interior faces of the transmissive substrate 130 and the corrective element 120 with a highly reflecting, e.g., R>90% dielectric layer. The substrate and corrective element are in turn coupled via mount 142 and translator 144 to the base 138.

In operation, the embodiment shown in FIGS. 1A–B allows both tuning of the wavelength in the external cavity and adjustment of the cavity length to avoid mode-hopping.

In FIG. 1A, a beam 124 is shown emanating from the front facet 106 of the laser amplifier 102. In one embodiment, the laser amplifier comprises a laser diode which preferentially amplifies linearly polarized light of a certain orientation. The beam is collimated by lens 108, subject to a change in polarization from linear to circular by quarter-wave plate 112 and focused by lens 110. The beam is focused by lens 110 so that the waist portion of the beam, i.e., the portion in which wave fronts are substantially planar, lies within the air-gap portion of etalon 162. The filtered beam passes through the transmissive substrate 130 and a second of the quarter-wave plates 114 to the retroreflector 122. Either or both the retroreflector 122 and the back facet 104 may be fully or partially reflective. In the embodiment shown, output beams 150–152 are shown passing through, respectively, the partially reflective retroreflector 122 and the partially reflective back facet 104 of the diode 102.

The tuning of the cavity is accomplished by translation of the wedge-shaped etalon 162 across the path of the beam 124. In the embodiment shown in FIG. 1, the translation of the etalon 162 is brought about by the translator 144 translating the etalon along translation axis 190. As the etalon translates along the translation axis 190, the laser beam intersects progressively narrower portions of the wedge-shaped air-gap thereby tuning for progressively shorter wavelengths at which to tune the cavity.

The required range of motion of the translator 144 along the translation axis 190 may be in the centimeter range in practice. A variety of compact motor technologies might be used to generate this displacement, e.g., thermomechanical, ultra-sonic motor, linear stepper, etc. In an embodiment of the invention, the translator 144 operates under the control of a tuner 160. The tuner may operate with or without a wavelength feedback element to select specific wavelengths at which to tune the cavity.

Etalon 162 has repeating loss characteristics called "orders". With interference filters/etalons, the orders are closely spaced. The filter/etalon can tune the laser away from a gain peak by ±½·FSR where FSR is the free spectral range or frequency separation of peaks. Thus, for example, for a tuning range of 50 nm, the free spectral range must be on the order of 6,250 GigaHertz at a wavelength of 1.55 $\mu$m.

As the laser is tuned, mode-hopping will occur unless the integer number of half-wavelengths in the external cavity is maintained constant. In order to accomplish this latter objective, a corrective element 120 is provided. In the embodiment shown, the corrective element is fabricated from an optically transmissive material with a uniform index of refraction. This corrective element has a wedge-shaped cross-section in the Y, Z plane. The exterior face of the corrective element 120 which faces the laser amplifier 102 may be AR coated.

By translating the corrective element 120 to vary the path length of the cavity in synchronization with the filtered wavelength of the etalon 162, a constant mode number is maintained in the external cavity while tuning the laser. The constant mode number results from the fact that during translation, as the etalon gap widens thereby tuning for longer wavelengths, the thickness of the corrective element increases. Since the index of refraction of the correction element is greater than that of the air, the overall average index of refraction in the external cavity is increased. This reduces the propagation speed of the beam and effectively lengthens the optical path length of the cavity.

Thus, by cascading the corrective element 120, e.g., glass wedge, with the wedged interference filter/etalon 162 to vary the path length of the cavity in synchronism with the filtered wavelength, a constant mode number is maintained in the cavity during the tuning of the laser.

FIG. 2A is a side view of the wedge-shaped air-gap etalon and corrective element portion of the tunable external cavity laser shown in FIGS. 1A–B. FIG. 2B is an exploded side cross-sectional view of the air gap and corrective element portion of the tunable laser. The etalon 162 and corrective element 120 are sandwiched between, on a proximal side, the focusing lens 110 and quarter-wave plate 112 and on a distal side, the quarter-wave plate 114 and retroreflector 122. In this embodiment, each of the components is aligned with and intersected by the optical axis 100. In this embodiment, the translation axis 190 is generally orthogonal to and intersects with the optical axis 100, though this need not be the case.

The maximum angle of the etalon wedge formed by the first and second reflectors 116–118, i.e., the tuning angle, is set by the requirement that the center shift over one beam diameter should be less than the etalon/filter full width at half maximum (fwhm).

The corrective element 120 is, in this embodiment of the invention, fabricated from an optical element having a uniform index of refraction. The corrective element has a wedge-shaped profile with exterior and interior generally planar surfaces which converge at a corrective angle 202. In the embodiment shown, both the corrective element 120 and the air-gap etalon 162 are coupled to mount 142, which is in turn coupled to translator 144. The translator 144 is affixed to the base 138 (See FIG. 1A). The translator is coupled to and controlled by the tuner 160. The tuner may include feedback elements, such as sensors, to monitor laser operating parameters, e.g., wavelength of the laser. In an embodiment of the invention in which the translator is a piezo electric element, the tuner would provide the electrical impulse to control the expansion and contraction of the piezo element along the translation axis 190. This would have the effect of translating both the air-gap etalon and the corrective element synchronously across the optical axis.

In FIG. 2A, the combined etalon and corrective element assembly is shown at a retracted position 204 and an extended position 206, linearly displaced from one another along the translation axis 190. FIG. 2B provides an exploded cross-sectional view of the paths 224–226 and 220–222 of the beam 124 at each of these positions through both the air-gap etalon 162 and the corrective element 120. In the retracted position 204, the beam traverses relatively thicker portions 224–226 of, respectively, the air-gap etalon and the corrective element. In the extended position 206, the beam traverses relatively thinner portions 220–222 of, respectively, the air-gap etalon and the corrective element. Thus, in the extended position of the etalon and corrective element, the etalon supports shorter wavelengths at which constructive interference takes place between the reflective surfaces of the etalon or higher frequencies of lasing. In the retracted position, the etalon supports longer wavelengths and lower frequencies of lasing at which constructive interference takes place. The required relationship between the change in the etalon gap "G" and the change in the optical path length "P" is $$\frac{dP}{P} = \frac{dG}{G}.$$

Absent the corrective element 120, the translational tuning of the air-gap etalon would result in mode-hopping since both the optical and actual length of the external cavity would be constant. The optical length "P" of a cavity is the sum of the product of refractive index "n" and thickness "L" along the optical axis of each of the elements "i" through which the beam passes. More specifically, the optical length of the external cavity is the sum of each of these products or $P=\Sigma n_i \cdot L_i$. In the embodiment shown in FIG. 2A, the corrective element 120 is a material fabricated from a substrate with a uniform index of refraction which varies in thickness and is affixed to and actuated by the same translator 144 which positions the etalon 162. Thus, the translation of the corrective element 120 provides a variation in the average index of refraction of the optical path. By synchronizing the etalon and corrective element, the average index of refraction along the beam path varies directly with the tuned wavelength thus maintaining the same integer number of half-wavelengths in the external cavity and avoiding mode-hopping.

In addition to the above-discussed mechanisms for providing cavity tuning by etalon translation and optical path correction, the embodiment of the invention shown in FIGS. 1–2 also diminishes the amount of spurious reflections 214 which are fed back into the laser amplifier 102. These spurious reflections arise when the laser beam strikes the first reflector 116. In the embodiment shown in FIGS. 1–2, the normals to either the first and second reflectors lie within the Z, Y reference plane. Because of the narrow wedge (a.k.a. tuning) angle between the reflectors, the beam intersects each of the reflectors substantially orthogonally. This results in out-of-band, unfiltered spurious reflections and spurious interference being fed back directly to the gain medium (See FIG. 2 reference 214, 210). This unwanted feedback is detrimental to the operation of the laser.

The quarter-wave plates 112–114 reduce the feedback from spurious reflections 214. The filter/etalon 162 operates in double-pass transmission for feeding back narrow band light to the gain medium. A high finesse interference filter/etalon has sharp transmission peaks. Light which is not transmitted by the filter/etalon 162 is reflected back toward the gain medium. This embodiment of the invention makes use of the fact that the gain medium preferentially amplifies substantially linearly polarized light, along with the polarization transforming properties of quarter-wave plates. The filtered light passes twice through both quarter-wave plate 112 and quarter-wave plate 114 and thus returns to the gain medium with the same polarization as it started with. The reflected light 214 passes twice through only quarter-wave plate 112 and thus returns to the gain medium with the orthogonal polarization it started with and thus is not amplified by the gain medium.

Figure 2C:
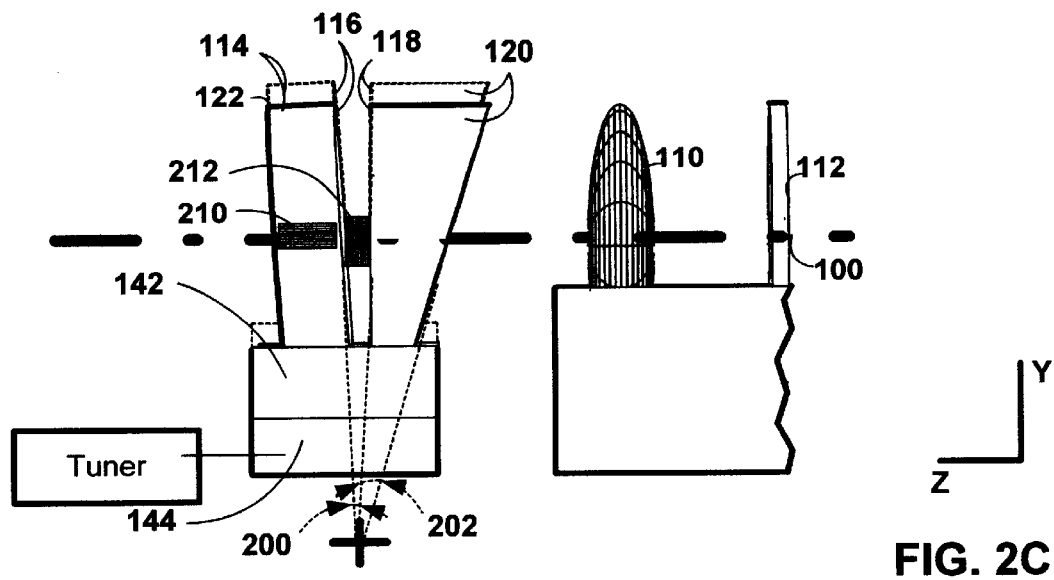
Figure 2D:
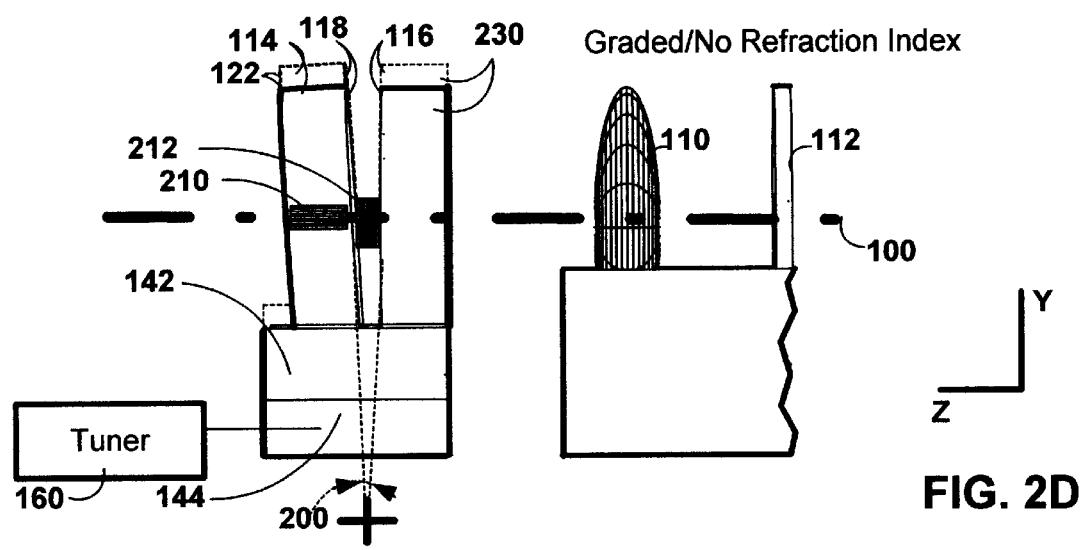

FIGS. 2C–D show alternate embodiments of the etalon and corrective element which retain each of the above-discussed features including translational tuning, as well as suppression of both mode-hopping and spurious reflections.

In the first of these embodiments shown in FIG. 2C, the second reflector of the air-gap etalon is affixed directly to the interior face of the quarter-wave plate 114 and the retroreflector 122 has been affixed directly to an exterior face of quarter-wave plate 114. The entire assembly including the associated wedge-shaped corrective element 120 is coupled via mount 142 and translator 144 to base 138 (not shown). These components are moved by the translator along the translation axis 190 (See FIG. 2A) with the same effects in terms of tuning and adjustment of the index of refraction of the external cavity to maintain an integer number of half-wavelengths in the cavity, as has been described and discussed above in connection with FIG. 2A. Additionally, the quarter-wave plates have a similar effect to that described and discussed above as well, i.e., suppressing spurious reflection of the beam from the first reflector 116.

In another embodiment of the invention shown in FIG. 2D, many of the features shown in FIG. 2B, including the combination of the retroreflector 122 with the quarter-wave plate 114 and second reflector 118, are retained. In this embodiment of the invention, the corrective element 230 is a substrate of uniform thickness but having an index of refraction graded along the translation axis. The graded index of refraction can be realized by various vacuum dopant diffusion techniques that increase the refractive index along the translation axis. The corrective element 230 is coupled via mount 142 and translator 144 to the base. As the translator extends and retracts the air gap, it also extends and retracts the corrective element across the optical path 100. This has the effect of causing the beam to intersect cross-sectional portions of the corrective element, which have greater or lesser indices of refraction thus effecting the overall optical path length of the cavity. As discussed above, the quarter-wave plates 112–114 provide for the suppression of spurious reflections of the beam off the first reflector 116.

Figure 2E:
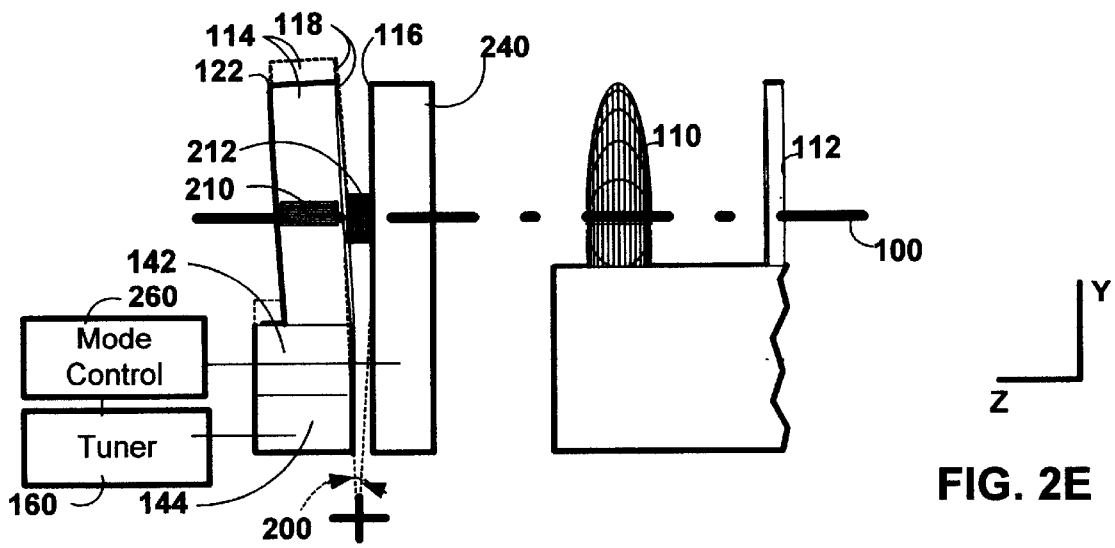

FIG. 2E shows an alternate embodiment of the invention in which both the corrective element and the first reflector 116 of the etalon are stationary. In this embodiment, only the assembly comprising the second reflector 118 of the etalon, the quarter-wave plate 144 and the retroreflector 122, are subject to translation along the translation axis 190 by means of the translator 144 (See FIG. 2A). The opposing first and second reflectors 116–118 maintain similar angular relationship, i.e., tuning angle 200, to that described and discussed above in connection with FIGS. 2A–D. The second reflector 118 is a generally planar surface intersected by the optical axis 100. The translation of the second reflector 118 along the translation axis results in a variation of the thickness of the air gap between the reflectors relative to the optical axis. This allows for the above-discussed tuning of the external cavity. Additionally, the corrective element 240 is fixed. In this embodiment the corrective element is fabricated from a material in which the refractive index can be varied by means of an electrical stimulus provided by a mode controller 260. The mode controller is coupled both to the corrective element 240, as well as to the tuner 160. The tuner extends and retracts the second reflector 116 of the etalon to increase or decrease the frequency at which the external cavity lases. Concurrently, the mode controller applies the appropriate electrical energy to the corrective element 240 so as to increase or decrease the refractive index of the element to vary the optical path length of the cavity so as to suppress mode-hopping during tuning of the laser.

Figure 3B:
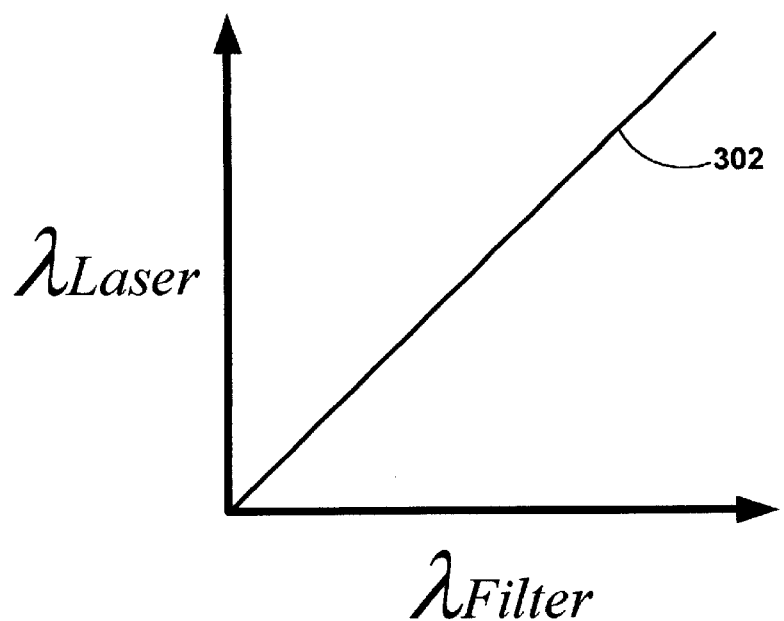
FIGS. 3A–B are graphs which show respectively mode-hopping and phase-continuous tuning of the external cavity laser shown in the accompanying figures.
Figure 3A:
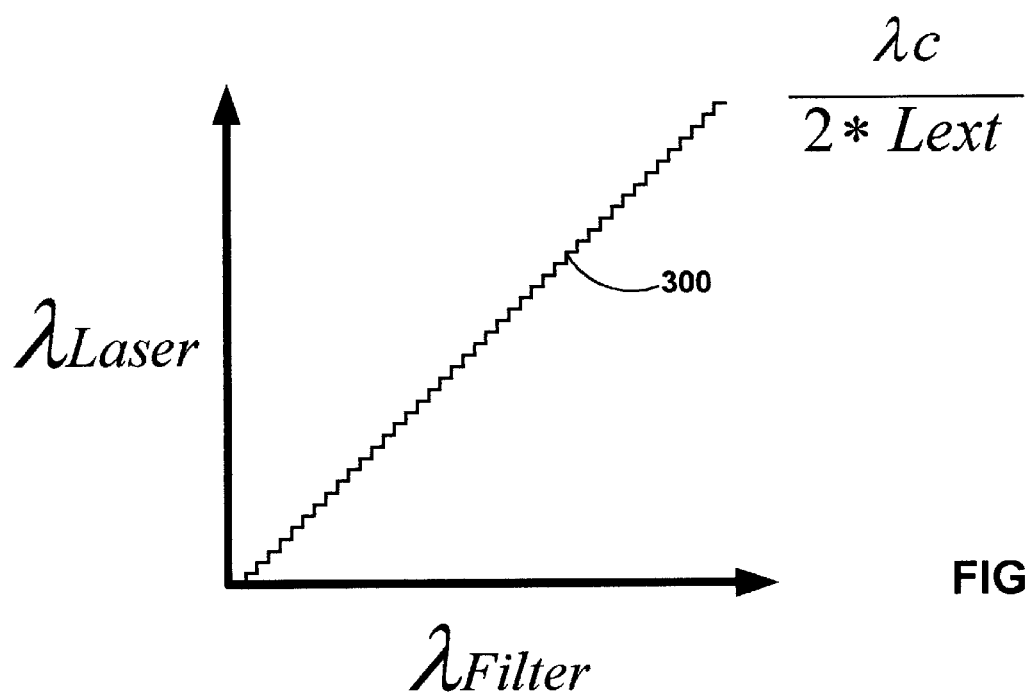

FIGS. 3A–B are graphs showing the operation of the tunable laser shown in FIGS. 1A–B and 2A–E, respectively, with and without the corrective element 120 (See also FIGS. 2C–E, reference numbers 230 and 240).

The wavelengths of the longitudinal modes of the laser cavity are related to the cavity length by $$L_{ext} \approx m \cdot \frac{\lambda_m}{2}$$

where m is an integer referred to as the mode number. Typically $m > 10^3$. The laser may only oscillate at wavelengths which are longitudinal modes. The size of the mode-hops is approximately $$\frac{\lambda_c^2}{2L_{ext}}$$

where $\lambda_c$ is the center of the tuning range. Therefore, if the cavity length remains constant as the filter/etalon peak is tuned, the laser output will change discontinuously, giving rise to a tuning characteristic known as mode-hop tuning (See FIG. 3A).

As shown in FIG. 3A, the tuning of a cavity without a corrective element involves a change in wavelength and in the integer number of half-wavelengths in the tuning cavity over the entire operating range. This in turn produces the discontinuous plot 300 of laser wavelength, versus the feedback wavelength generated by the etalon/filter.

If, on the other hand, cavity length can be varied so that $$L_{ext} = M \cdot \frac{\lambda}{2}$$

for a fixed integer M, as the laser wavelength $\lambda$ is varied, then the laser will always oscillate at the same mode number. In other words, there will be no mode-hops and the laser wavelength will track the filter wavelength in continuous fashion. This type of tuning is called mode-hop-free or phase-continuous tuning and is illustrated in FIG. 3B. To ensure single longitudinal mode operation with a high sidemode suppression ratio, the filter must create a differential loss between the lasing mode and the neighboring longitudinal modes. Lasing will occur at the peak of the net gain. Sidemode rejection depends on the full width at half-maximum (fwhm) of the filter loss profile compared to $$\frac{c}{L_{ext}}$$

where $L_{ext}$ is the length of the external cavity. The ideal, though not necessary condition, is that $$fwhm \approx \frac{c}{L_{ext}}.$$

This condition can be approached with interference filter/etalon based technology.

As shown in FIG. 3B, the plot 302 of lasing wavelength, versus the wavelength tuned for by the etalon/filter is substantially continuous, i.e., without discontinuities resulting from mode-hopping. This phase-continuous tuning is achieved by a corrective element, which, in any of the embodiments shown in FIGS. 2A–E and elsewhere, has the property of increasing the optical length of the cavity as the wavelength to which the cavity is tuned increases.

FIGS. 4A–B show an alternate embodiment of the invention which allows for suppression of both spurious reflections and spurious interference without the use of intracavity wave plates. FIG. 4A is an isometric side view of the tuning and corrective element portion of the laser while FIG. 4B is a top view. The laser includes a lens system 440 which focuses the waist region of the laser beam on the etalon so that it is elongated on a major axis and compressed along a minor axis resulting in a substantially elliptical cross-sectional profile 410. The major and minor axes along which the expansion and compression of the beam takes place lie in a plane parallel to the X, Y plane. The minor axis along which the beam is compressed is substantially co-linear with the above-discussed translation axis 190 along which the wedge-shaped etalon is translated. The wedge or tuning angle 200 lies substantially with the Z, Y plane.

As shown in FIG. 4B, the entire tuning and correction assembly comprising in this embodiment the translator 144, mount 142, etalon 162, corrective element 120, and substrate 130, is displaced arcuately about the translation axis by a tilt angle 402. This angulation, on the order of 6 degrees, is sufficient to cause spurious reflections 214 to vector away from the optical axis 100. Additionally, this embodiment provides for the spurious interference 210 to be directed away from the optical axis. This results in a higher fidelity of the tuning of the laser as well as the elimination of quarter-wave plates or their equivalent.

Figure 5B:
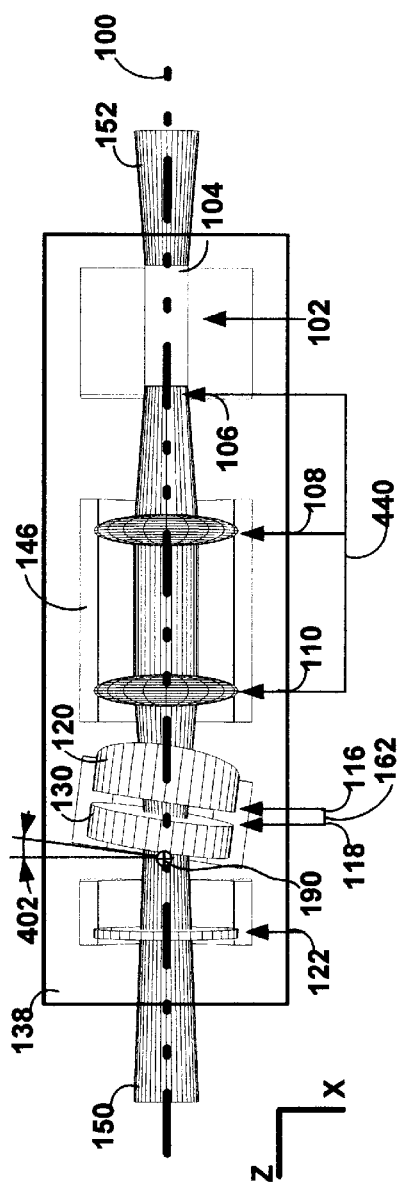
FIGS. 5A–B are respectively detailed isometric and top views of an external cavity diode laser incorporating an embodiment of a lens system suitable for use with the novel etalon and corrective elements shown in FIGS. 4A–B.
Figure 5A:
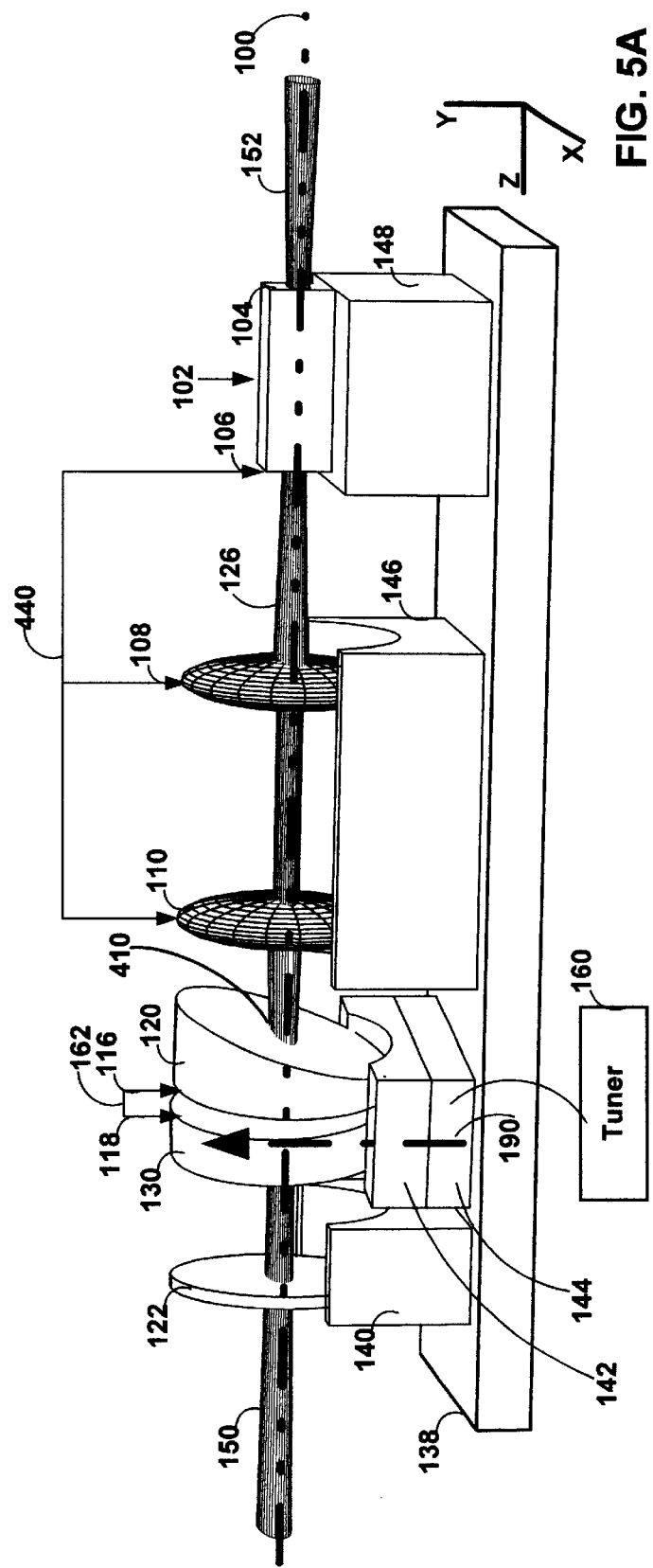

FIGS. 5–7 show alternate embodiments of the anamorphic/astigmatic lens system 440. FIGS. 5A–B are isometric and top views of an embodiment of the astigmatic/anamorphic lens system 440. In this embodiment the laser diode 102 is fabricated with a wave guide which produces a highly elliptical output beam 126. Lenses 108–110 serve respectively to collimate and focus the elliptical beam 126 into an elliptical cross-sectional profile 410, the waist region of which falls within the etalon 162. The compression of the beam along both the Y and the translation axis 190 improves the precision with which the etalon is capable of tuning the laser. The expansion of the beam along the X axis increases walk-off loss in the spurious interference 210 produced between the second reflector 118 of the etalon and the retroreflector 122. This improves the operating characteristics of the laser by reducing the feedback to the gain medium from the spurious interference.

FIGS. 6A–B are isometric and top views of an alternate embodiment of the astigmatic/anamorphic lens system 440. In the embodiment shown in FIG. 6A the astigmatic lens system distorts the beam 124 along both the X and Y axis. Along the Y axis, the beam is compressed; along the X axis, the beam is expanded. This produces the desired elliptical cross section 410 with a waist region of the beam having an elliptical cross-section within the etalon 162. The astigmatic lens system 440 comprises two cylindrical lenses 608–610 positioned between the front facet of the laser 106 and the corrective element 120. Longitudinal axis of each of these cylindrical lenses are orthogonal one to the other.

Figure 7A:
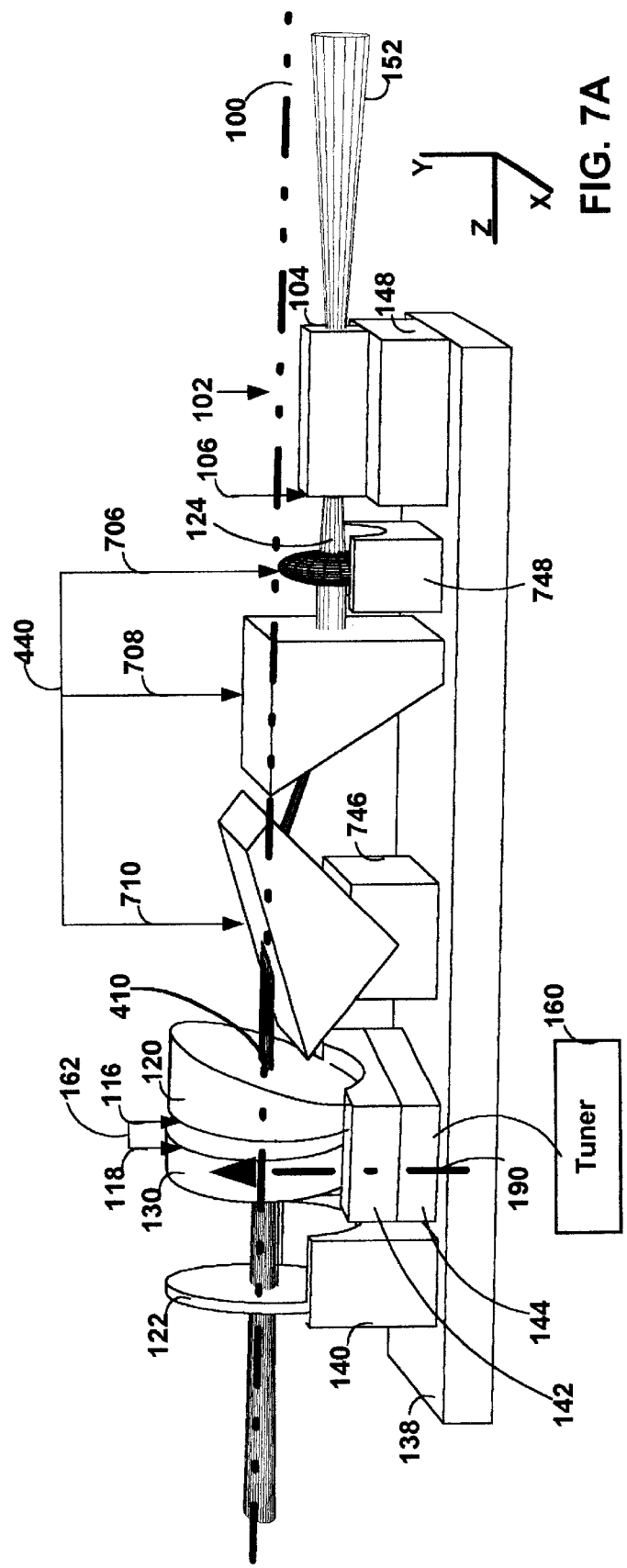
FIGS. 7A–B are respectively detailed isometric and top views of an external cavity diode laser incorporating still another embodiment of a lens system suitable for use with the novel etalon and corrective elements shown in FIGS. 4A–B.
Figure 7B:
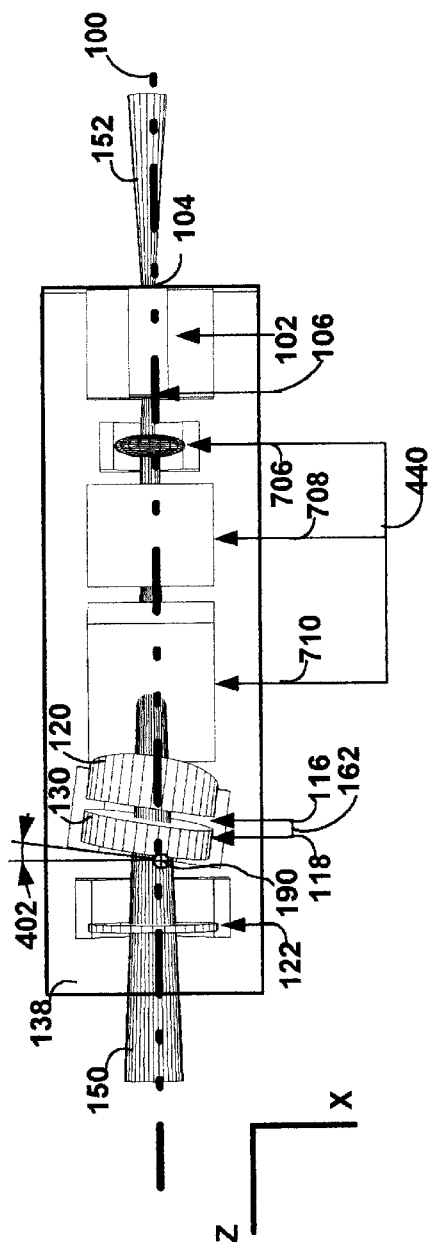

FIGS. 7A–B are respectively isometric side and top views of another embodiment of the anamorphic/astigmatic lens system 440. In this embodiment, anamorphic prisms 708–710 and focusing lens 706 compress the beam 124 along an axis (i.e., the Y axis) so that it achieves the desired elliptical profile 410 and its waist region is located within the etalon 162.

Each of the arrangements described and discussed above shows, for purposes of clarity of exposure, a translation axis which is generally parallel with the Y axis of reference. This need not however be the case. In alternate embodiments, the translation axis may not be parallel with the Y axis, provided only that the appropriate displacement of either of the first or second reflectors can be provided for the tuning of the cavity.

Voice Coil Tuned External Cavity Lasers

Voice coil actuators (VCAs) offer linear or arcuate movement which can be utilized for the tuning of ECDLs of either a Littman configuration or in an interference filter-tuned resonant cavity. In the Littman configuration, tuning is accomplished by arcuate motion of either a diffraction grating or a retroreflector positioned on the proximal end of an arcuate voice coil actuator which selects a feedback wavelength to the gain medium to tune the ECDL. The arcuate voice coil actuator allows rapid positioning which allows for FM tuning or linear FM sweeps. Where tuning is accomplished by an interference filter, either linear or arcuate motion of the voice coil actuator may be utilized to select a feedback wavelength to the gain medium to tune the ECDL.

FIGS. 8A–B, 9A–B, and 10A–B show an interference filter-tuned ECDL. In FIGS. 8A–B the interference filter is linearly activated by a VCA. In FIGS. 9A–B and 10A–B, the interference filter is arcuately actuated by a VCA. In either type of VCA, the magnetic field produces a force on the coil when a current is passed through it, creating either linear motion or motion in an arc of a circle. The force is given by the following Equation 1; where: F is the force generated in the coil, N is the number of turns of the coil, L is the length of the coil exposed to the magnetic field, and i is the applied current.

$$F=NLBi \qquad \text{Equation 1}$$

The VCA generally possesses substantially linear control characteristics, substantially zero hysteresis, and very fine position resolution. The position resolution may be mainly limited by current noise in the drive electronics. In practice, position resolution may be less than 0.1 microns. Additionally, VCA drive systems may have low electrical and mechanical time constants and high output power to weight and volume ratios compared with conventional ECDL actuators, such as stepper and DC motor systems.

FIGS. 8A–B, as well as FIGS. 9A–B and 10A–B show the combination of an interference element with linear and arcuate voice coil actuators. In alternate embodiments of the invention, these actuators may also be used to tune other ECDL tuning elements. These tuning elements include interference element(s), diffraction element(s), retroreflector(s) etc. Interference elements include air-gap and solid etalons. Diffraction elements include gratings and reflectors. Retroreflectors include dihedral prisms, corner cubes and mirrors. An added advantage of the voice coil actuators, either linear or arcuate, is that they may be fabricated with a relatively low mass, compared to that of conventional ECDL actuators such as stepper or DC motors. This low mass improves the response time, wavelength sweep speed and FM range of the ECDL.

The interference element, e.g., air-gap etalon, shown in FIGS. 8–12 may exhibit both the capability to reduce spurious feedback as well as the capability of compensating for changes in optical path-length to maintain a substantially constant integer number of half-wavelengths within the resonant cavity of the ECDL. These capabilities may be implemented in either an air-gap or a solid etalon without departing from the scope of the claimed invention. When the novel etalons disclosed herein are combined with voice coil actuators, either linear or arcuate; the tuning assembly, i.e., tuning element and actuator, can be fabricated with a relatively low mass, e.g., less than one gram, compared to that of conventional ECDL actuators, such as stepper or DC motors. This low mass improves the response time, wavelength sweep and FM range of the ECDL.

The linear and arcuate etalons shown in FIGS. 8–12 are constructed such that the spacing between opposing reflective surfaces varies linearly across its optical aperture. Thus, when a small-diameter optical beam is incident on the etalon, the transmission wavelength will vary as the etalon is displaced in a plane normal to the beam path. The trajectory of this displacement may either be a line segment or an arc. Depending on which type of motion is desired, the etalon is moved by either a linear or rotary VCA. Small, inexpensive, high bandwidth VCAs are utilized in optical and magnetic data storage systems. The stroke (length of travel) of a linear VCA ranges from microns to a quarter of an inch. Suitable VCAs may be obtained from Aura Systems, Inc.; BEI Sensors & Systems Co., or Planning Systems, Inc. FIGS. 8A–B show an alternate embodiment of the actuator for the etalon. In this embodiment, the actuator is an electrically activated voice coil or solenoid 800–802 which extends and retracts the etalon 162 across the optical path 100 to provide a feedback wavelength to the gain medium 102 to tune the laser.

FIG. 8A is an isometric side view of an embodiment of an interference tuned external cavity diode laser. A resonant cavity is formed between a gain medium 102 and an external retroreflector 122, both of which are attached to the base 138 via mounting blocks, respectively, 148 and 140. The opposing end of the resonant cavity is defined by the external retroreflector 122 which is also mounted to the base via mounting block 140. The interference element, e.g., air-gap etalon 162, is positioned within the resonant cavity. The interference element couples to the base via a voice coil/solenoid 800–802. The base portion 800 of the solenoid is affixed to the base 138. The piston portion 802 of the solenoid extends and retracts along axis 190 away from or toward the base 138 thus moving the wedge-shaped air-gap etalon 162 across the optical path 100 extending between the gain medium and external retroreflector 122. Intermediate the air-gap etalon 162 and the gain medium is shown collimating and focusing optics 440 (See FIGS. 4–7).

FIG. 8B is a cross-sectional elevation view of the voice coil/solenoid 800–802 shown in FIG. 8A coupled to a tuner 160. The piston portion 802 of the voice coil is fixedly coupled to electrical windings 804 which extend downward from the piston in a tubular configuration. At the center of the piston, a positioning element 806 is shown extending vertically downward. The piston 802 is extensibly coupled to the base 800 via permanent magnets 808 and lamination stacks 810 which define between them a tubular annulus which surrounds the coils 804. A center hole in the lamination stacks surrounds the position sensor.

Within the tuner 160, a processor 820 and memory 822 are shown. The memory includes both program code as well as a lookup table 824. The lookup table contains data or formula which correlate wavelength with position. In the embodiment shown, the lookup table contains a plurality of records each containing a wavelength field 840 and a position field 842. These fields record, respectively, the correlation between a displacement of the piston 802 with respect to the base 800 and a corresponding wavelength of the tunable laser.

In operation, processor 820 receives a request to tune the resonant cavity to a specific wavelength. The processor utilizes the lookup table 824 to determine the appropriate displacement/position of the piston with respect to the base. The processor then applies appropriate electrical energy to the coil 804. The electrical current in the coil develops a magnetic force on the coil in either a positive/negative direction, substantially normal to the magnetic flux created by the permanent magnets 808 within the piston. As a result, the piston is displaced with respect to the base. Using feedback supplied by the position detector 806, the processor regulates the energy supplied to the coils to maintain the displacement between piston and base at the required level corresponding to that shown in the lookup table.

The piston and base may be dynamically positioned with respect to one another using electrical energy alone for both the extension and retraction of the piston. Alternately, a return spring (not shown) may be utilized to bias the piston 800 toward/away from the base with the energy applied to the coils 804 serving to offset the spring force and move the piston.

Closed Loop Control of Output Wavelength

Closed loop feedback of the tuning element, e.g., interference filter, diffraction element or retroreflector, may be accomplished by a number of devices including encoders, e.g., electrical/optical/magnetic; position sensors, and optical sensors, without departing from the scope of the claimed invention. The ECDL actuator, e.g., voice coil, can be operated in several modes, including positioning mode, with the assistance of some position feedback device. The tuning element, e.g., VCA, shown in FIGS. 8A–B uses a position feedback device which may be either an encoder or sensor. Suitable position sensors include, inductive, and glass scale position feedback devices. Some of the sensor technologies mentioned above work based on proximity measurements and do not actually require physical contact with the etalon. The voice coil actuator may also be operated with a wavelength feedback control loop using either a sensor or encoder.

Alternatively, the ECDL actuator, e.g., VCA, may be equipped with an optical, magnetic or other read or read/write head, and an associated encoder such as that shown in FIGS. 10A–B and 11. The encoder may be affixed to the tuning member, e.g., etalon, with the head affixed to a stationary member such as the base, and vice-versa. Where the encoder is optical, the reader may include a light source and an optical detector. In an alternate embodiment of the invention, calibration data might be written onto a stationary storage medium during calibration at the factory or may be written onto the encoder itself. Where the encoder is write-programmable, each tunable ECDL may be individually calibrated across the entire tuning range during fabrication of the device using an external wavelength meter.

FIGS. 9A–B show isometric side and rear views of an alternate embodiment of the invention utilizing an arcuately positioned interference element 920 to tune an external cavity diode laser. The arcuate actuator, in this embodiment of the invention, shares mechanical similarities with the voice coil arcuate actuators utilized in computer disk drives. The tuning arm 940 is pivotably coupled at its center portion to the base 900 via a bearing post 930 which extends orthogonally upward from the base. In this mounting configuration, both the proximate and distal ends, 946 and 942, respectively, of the tuning arm move arcuately within a plane parallel to an upper surface of the base 900. A molded electrical coil assembly 950 is affixed to the proximal end of the tuning arm. This coil is energized via lead wire 952 and includes radially opposing sides. Between the coil and the base are positioned two adjacent permanent magnets 960–962 of opposite polarity and with dipoles generally orthogonal to the upper surface of the base 900. When electrical energy of a first polarity is supplied through lead 952 to coil 950 a temporary magnetic field is generated which results in the movement of the distal end of the pivot arm toward one of the oppositely polarized permanent magnets 960–962. Conversely, when an electrical signal of an opposite polarity is applied via signal wire 952 to the actuator coil 950, a magnetic field of opposing polarity is created with the resultant movement of the distal end of the pivot arm to the opposite permanent magnet. In an alternate embodiment of the invention, the locations of the magnet(s) and actuator coil are reversed with the magnet(s) on the tuning arm and the coil affixed to the base.

At the opposing, i.e., distal end of the tuning arm, a wedge-shaped interference element, e.g., etalon 920 is affixed. In the embodiment shown, the interference element is an air-gap etalon with a transmissive substrate 922 and a corrective element 924, affixed to upper and lower surfaces of the distal end of the tuning arm. The air gap defined between reflective interior surfaces of the etalon is wedge-shaped. The etalon 920 moves arcuately within an orthogonal resonant cavity defined between a gain medium within housing 902, and a rear retroreflector 914. The housing 902 is affixed to the base in an orientation which directs the laser beam 904 toward a corner cube 908, which is also affixed to the base. When the laser beam strikes the corner cube 908, it is deflected upward along a path 972 normal to the base. That path intersects the wedge-shaped air gap of the air-gap etalon 920. As the etalon is moved arcuately by tuning arm 940 in a plane intersected by the beam path, the thickness between opposing reflective surfaces on either side of the air gap increases and decreases depending on the direction of motion. This is turn selects the specific wavelength at which lasing will occur in the resonant cavity through feedback of the selected wavelength to the gain medium via reflection from the corner cube 908. Light which passes through the transmissive substrate of the etalon 922 strikes retroreflector 914. An output beam may be provided either through the back facet of the gain medium along axis 970, or through the retroreflector 914 along axis 972.

In an alternate embodiment of the invention, the upper surface of the transmissive substrate 922 would be coated with a reflective material thus serving as a retroreflector.

Numerous variations of the arcuately tuned etalon 920 are possible without departing from the scope of the claimed invention. The etalon shown provides a wedge-shaped air gap. In an alternate embodiment of the invention, a wedge-shaped solid etalon with reflective angularly opposing outer surfaces is affixed to the distal end of the actuator. In still another embodiment of the invention involving the air-gap etalon 920, only one of the etalon elements, i.e., either the transmissive substrate 922 or the corrective element 924, is affixed to the actuator, i.e., tuning arm 940, with the other fixed to the base. The etalon element affixed to the actuator will tune the etalon and provide tunable feedback to the gain medium, e.g., laser diode, provided that the etalon element affixed to the actuator has a reflective surface which lies in a plane that diverges from the plane in which the tuning arm rotates. Thus, as that element is swept by the actuator across its stationary counterpart, the spacing, i.e., thickness between the two along the optical path will vary. This in turn will vary the feedback wavelength to the gain medium thereby tuning the laser to a selected wavelength.

In the embodiment shown, output wavelength selection is made by means of an optical reader, e.g., laser positioned within housing 902. That laser emits a beam 906 which strikes a second corner cube 910 which deflects it vertically upward to strike an optically encoded strip (See FIGS. 10–11). The reflected beam contains information stored on the encoder, which information is read by an optical reader also housed in housing 902 to determine the correlation between arcuate position of the etalon 920 and the output wavelength of the resonant cavity. In an alternate embodiment of the invention, the optically encoded strip is affixed to the base and the reader is coupled to the tuning arm, passing over the strip as the laser is tuned.

As will be obvious to those skilled in the art, numerous variations of the geometry shown may be implemented without departing from the scope of the invention. In an embodiment of the invention, the arcuate motion of the tuning element may lie in a plane normal to the base. In this embodiment the resonant cavity may be linear rather than orthogonal.

In the embodiment shown in FIGS. 9A–B, a degree of shock resistance is provided when the device is designed such that the moments of inertia of the proximal end 946 and the distal end 942 of the tuning arm 940 are substantially equal. In still another embodiment of the invention, it may be possible to reduce the form factor by positioning the laser between the tuning arm and the base. Further compaction in the form factor may be provided by positioning both actuator coil 950 and the magnets 960–962 on the distal end 942 of the tuning arm, thereby avoiding (except for shock balancing considerations) the need for a proximal end of the tuning arm.

Programmable Encoder for Closed Loop Control of an ECDL Tuning Element

FIGS. 10A–B show top plan and side elevational views of the arcuately tunable interference filter discussed above in connection with FIGS. 9A–B. Additionally, in both FIGS. 10A–B, the associated calibration and control circuitry for utilizing the arcuately tuned interference filter is shown. In both FIGS. 10A–B, a tuner 1000 is shown coupled to the laser, actuator, and the read/write encoder head of the interference tuned ECDL. The tuner includes a processor 1002, a memory 1004, positioning logic 1008, and read or read/write logic 1010. Program code 1006 stored within memory 1004 controls the operation of the processor. In the embodiment shown, the positioning of the etalon 920 is controlled by drive signals applied by positioning logic 108 to the actuator 950 in conjunction with closed loop feedback of output wavelength provided by an encoder 1030. The encoder 1030 is affixed to the lower surface of the lower plate 924 of the air-gap etalon. The encoder contains output wavelengths corresponding to each position of the encoder within the resonant cavity. An optical reader positioned within housing 902 emits a laser beam which strikes corner cube 910 and is deflected upward to strike the encoder. The reflected signal from the encoder contains wavelength information corresponding to the subject position of the etalon, which is read by an optical reader also positioned within housing 902. That information is passed to the read logic 1010 where it is used as part of a feedback control loop to allow the processor 1002 and positioning logic 1008 to energize the actuator coil 950 appropriately.

In the embodiment shown, the actuator arm 940 is energized in both a clockwise and counterclockwise direction by means of the actuator and permanent magnet assembly. In an alternate embodiment of the invention, a return force could be provided in either a clockwise or counterclockwise direction, without departing from the scope of the claimed invention. The subject technology, i.e., linear/arcuate voice coil tuners, may be applied with equal advantage to other ECDL tuning elements, such as diffraction elements and retroreflectors, without departing from the scope of the claimed invention.

Position feedback in the embodiment shown is accomplished via an optical encoder. As will be obvious to those skilled in the art, other types of encoders may be utilized with equal advantage, including electrical and magnetic encoders. In still another embodiment of the invention, position feedback may be accomplished by an electrical, optical or magnetic position sensor.

In embodiments of the invention which utilize an encoder, various degrees of precision between the given selected output wavelength and the actual output wavelength of the subject ECDL may be realized, depending on the manner in which encoding is implemented. In a first embodiment of the invention, a standard encoder is attached to all the ECDLs within a model or product line. In this embodiment, the encoders are a read-only medium on which have been stored specific indicia and/or data from which the position and/or output wavelength can be determined for a statistically average ECDL. The accuracy of this approach will vary, along with the statistical deviations of each ECDL, from the norm. Additionally, even if a subject ECDL has tuning characteristics approaching the statistical norm, it is still necessary to precisely affix the encoder and reader in order to obtain the required relationship between actual output wavelength and encoded wavelength/position.

Where a higher degree of accuracy between selected and actual output wavelength is required, it may be advantageous to affix a blank read/write programmable encoder to the tuning element, e.g., air-gap etalon. In this embodiment of the invention, the tunable laser is fabricated with the encoder affixed to the tuning element without any stored data as to either wavelength or position. Within the housing 902 is positioned a read/write encoder head. That head may rely on electric, magnetic, or optical write capability to encode information on the encoder strip 1030. To calibrate the ECDL, data provided by a wavelength meter 1020 coupled to an output beam of the ECDL is utilized program the encoder. The wavelength meter is only utilized during the calibration step that follows and need not be shipped with the ECDL itself. Instead output wavelength information or position information which can be correlated with output wavelength is stored directly on the encoder. This results in a reduced form factor cost and complexity in the subject instrument.

To calibrate the ECDL, the positioning logic 1008 sweeps the air-gap etalon through the entire tuning range, pausing at increments along the tuning range to allow the wavelength meter to measure an output wavelength and to allow the writing of the associated wavelength via the read/write encoder to the appropriate radial or linear segment of the encoder strip 1030. At the end of this process, the encoder strip contains device-specific output wavelength information along its length. With the wavelength information thus embedded in the encoder, the tunable laser is shipped with only the tuner 1000 and without the wavelength meter 1020. In operation, a high degree of precision between selected and output wavelength is possible due to the device-specific information contained on the encoder strip.

In still another embodiment of the invention, the cost associated with including read/write capability in the subject units may be avoided in favor of read only capability, provided that during factory calibration the appropriate optical electric or magnetic encoding capability is provided to embed the information provided by the wavelength meter onto the programmable encoding strip 1030.

As will be obvious to those skilled in the art, the above-discussed encoding technology may be utilized with equal advantage and without departing from the scope of the claimed invention in conjunction with alternate tuning elements of external cavity lasers including, but not limited to, retroreflectors and diffraction elements.

An Arcuately-Tuned Interference-Filter for an ECDL

FIG. 11 is a detailed side elevation view of the housing 902 and etalon 920 shown in FIGS. 9–10. A gain medium within housing 902 emits a beam 904 which strikes corner cube 908. That beam is deflected orthogonally upward along path 972 through the etalon 922. The air-gap etalon is defined between the opposing reflectors 1110–1112 which are affixed to opposing interior surfaces of the transmissive substrate 922 and the corrective element 924 respectively. Light which passes through the etalon strikes the reflective element 1100 of the retroreflector 914. As the wedge-shaped etalon cuts arcuately through the beam path 972, the thickness of the air gap varies, thereby selecting a specific wavelength at which feedback to the gain medium within housing 902 will take place. This results in tuning of the resonant cavity. In the embodiment shown, then encoder 1030 is affixed to the bottom surface of the corrective element 924. In the embodiment shown, the encoder is optically readable by means of an outgoing and return ray 906 which passes from an optical detector within housing 902. This encoder contains the above-discussed position and/or wavelength information with which the closed loop feedback discussed above in connection with FIG. 10 may be implemented.

In an alternate embodiment of the invention, a lens system is positioned in the optical path between the gain medium, e.g., laser diode, within housing 902 and the etalon 920 to focus the beam on the etalon. As discussed above in connection with FIGS. 4–7, that lens system may focus the waist region of the laser beam on the etalon so that it is elongated on a major axis and compressed along a minor axis resulting in a substantially elliptical cross-sectional profile. The minor axis along which the beam is compressed is substantially tangent to the arcuate path of the etalon.

Figure 12B:
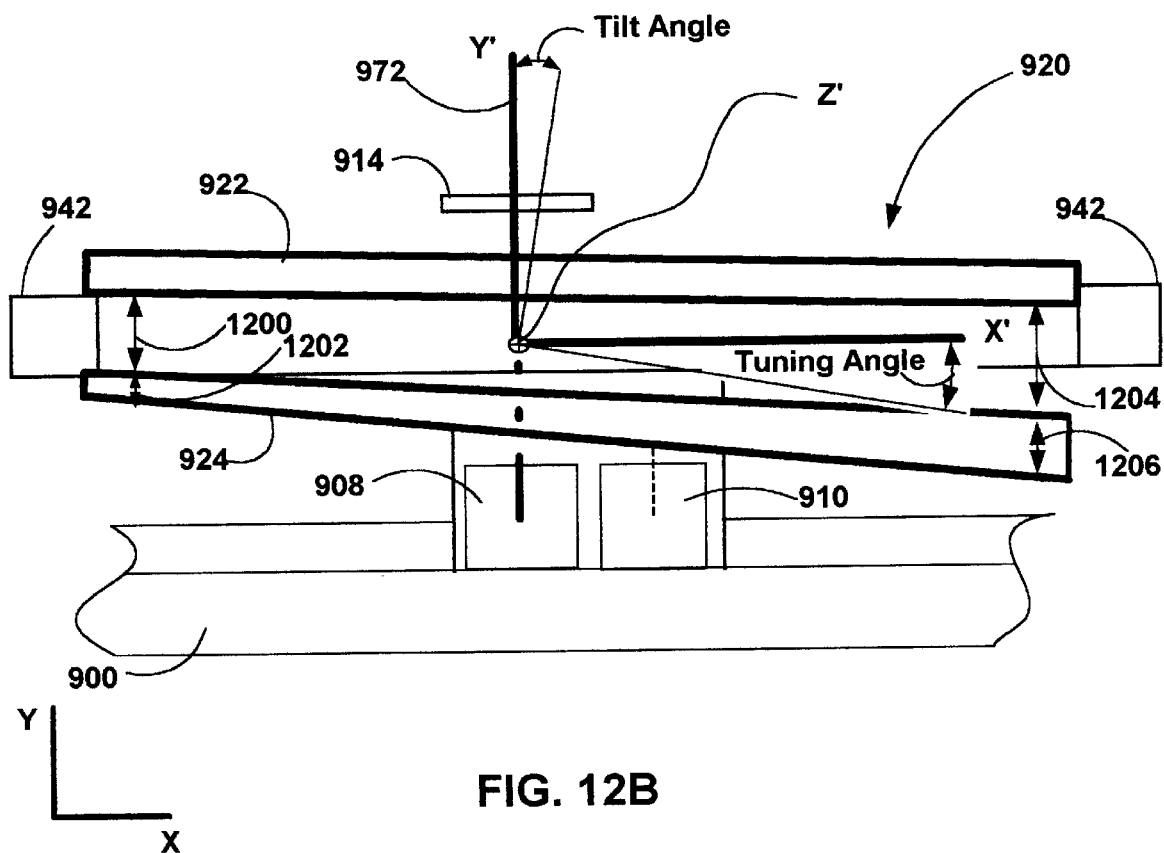
FIGS. 12A–B are end elevation views of alternate embodiments of the interference filter tuning element of the resonant cavity shown in FIG. 11.
Figure 12A:
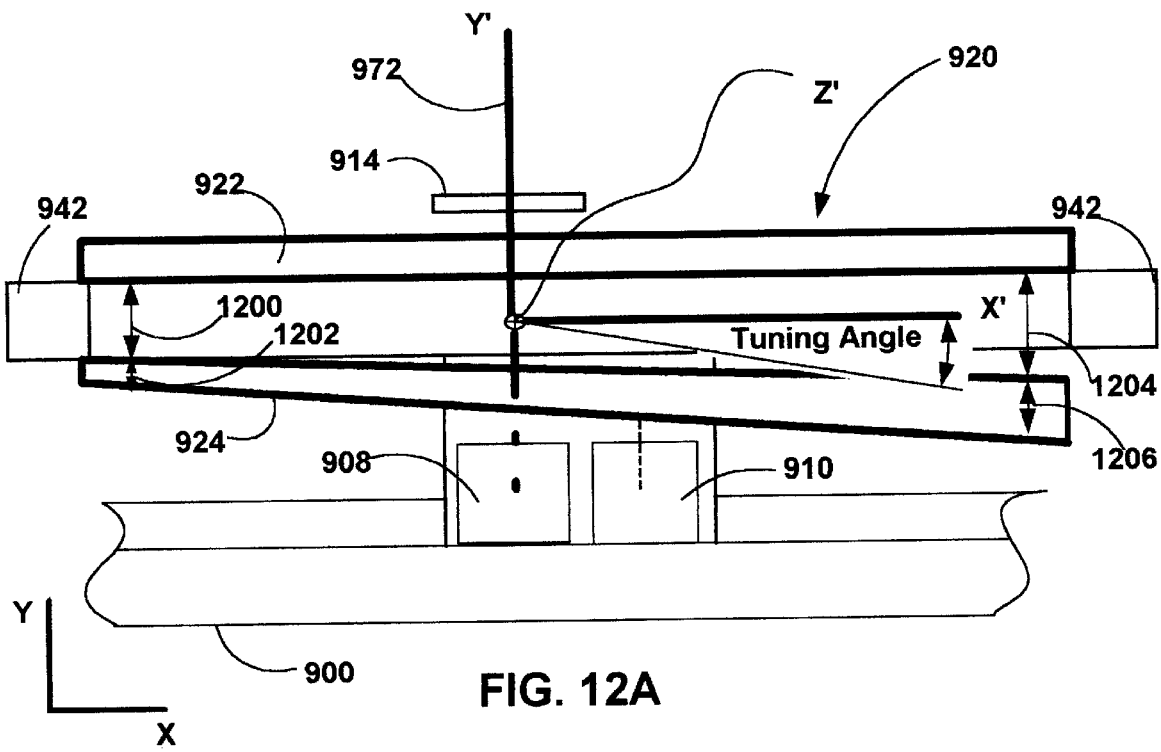

FIGS. 12A–B are elevation end views looking inward from the position of the laser at alternate embodiments of the interference element, e.g., air-gap etalon 920. In both figures, the corner cubes 908–910, the base 900, the retroreflector 914 and the distal end of the tuning arm 942 are shown. In the first embodiment shown in FIG. 12A, the transmissive substrate 920 is orthogonal to the optical path 972. The interior reflective surfaces of the corrective element 924 and the transmissive substrate 922 diverge from one another at a tuning angle. On one end of the etalon, both the air gap thickness 1200 and corrective elements 1202 are less than the air gap thickness 1204 and corrective element thickness 1206 on the other end of the etalon. The tuning angle governs the variation in air gap across the length of the etalon. This in turn correlates with the tunable range of the ECDL. The principles discussed above in connection with FIGS. 1–3 may be implemented with equal advantage in the arcuately tunable interference element shown in FIG. 12A.

In FIG. 12A the corrective element 924 may include a uniform index of refraction. In that embodiment of the invention, the thickness of the corrective element increases in correspondence with the thickness of the air gap, thus providing a uniform optical pathlength across the entire tuning range. Alternately, the corrective element might have a uniform thickness and a linearly varying refractive index, thus also providing a uniform optical pathlength across the entire tuning range.

In an alternate embodiment of the invention shown in FIG. 12B, the etalon 920 including both the transmissive substrate 922 and the corrective element 924 are oriented at a tilt angle representing a rotation about the Z axis. This orientation of the etalon reduces, as discussed above in connection with FIGS. 4–7, spurious interference and feedback to the gain medium.

In an alternate embodiment of the invention the etalon is a solid arcuate wedge with diverging reflective outer surfaces.

Figure 13:
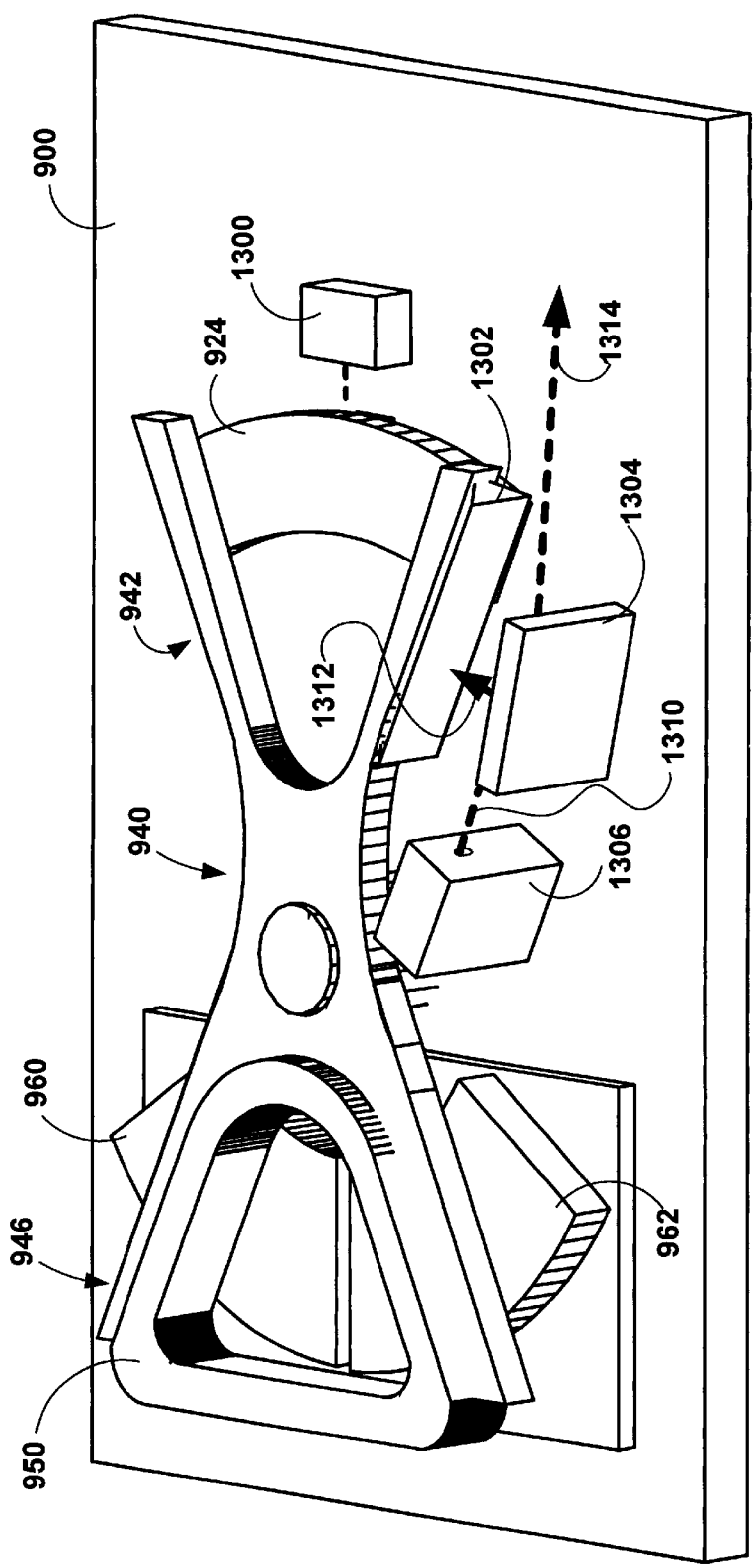
FIG. 13 is an isometric side view of an embodiment of the arcuate actuator with a grating and retroreflector to tune an external cavity diode laser.

FIG. 13 is an isometric side view of an embodiment of the arcuate actuator with a grating and retroreflector to tune an external cavity diode laser. A retroreflector 1302 is coupled to the distal end 942 of the arcuate actuator 940. A laser 1306 and diffraction element, e.g., grating 1304 are coupled to the base 900. The laser emits a beam 1310 at a grazing angle to the grating. This beam is reflected 1312 toward the retroreflector. The wavelength feedback to the laser is determined by the orientation of the laser, grating, and retroreflector. The pivot of the actuator is, in an embodiment of the invention, positioned so as to maintain substantially a constant integer number of half-wavelengths in the external cavity across the tuning range. This reduces mode-hopping. A useful output beam 1314 is provided. In an alternate embodiment of the invention, tuning may be provided by the diffraction element instead of the retroreflector. The arcuate voice coil actuator allows rapid positioning which allows for FM tuning or linear FM sweeps. The optical read/write element may be used in conjunction with a recording media affixed to plate 924 to control the tuning of the laser as discussed above.

The foregoing description of a preferred embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. A tunable external cavity laser, comprising:
   a gain medium to emit a beam;
   a tuning element moveably positioned in a path of the beam to provide feedback of a selected wavelength to the gain medium; and
   a voice coil actuator coupled to said tuning element and responsive to an electrical signal to position said tuning element in the path of the beam to provide feedback of a selected wavelength to the gain medium to tune the tunable laser.

2. The tunable external cavity laser of claim 1, wherein said tuning element comprises at least one of: an interference element, a diffraction element, and a retroreflector.

3. The tunable external cavity laser of claim 1, wherein said tuning element comprises an etalon with opposing first and second reflectors coupled at an angle to one another.

4. The tunable external cavity laser of claim 3, wherein said first and second reflectors define between them a wedge-shaped gap.

5. The tunable external cavity laser of claim 3, wherein the turning element comprises:
 a wedge-shaped substrate defining between opposing first and second faces the wedge; and the first and second reflectors affixed to the first and the second faces, respectively.

6. The tunable external cavity laser of claim 5, wherein the corrective element further comprises:
 a substrate including a graded index of refraction defined across the path of the beam.

7. The tunable external cavity laser of claim 5, wherein the corrective element further comprises:
 an optical element in which an index of refraction varies with an electrical signal applied thereto.

8. The tunable external cavity laser of claim 3, further comprising:
 a corrective element coupled to at least one of said first and said second reflectors, and said corrective element for varying the optical length of the cavity to suppress mode-hopping during tuning of the tunable external cavity laser.

9. The tunable external cavity laser of claim 6, wherein the corrective element further comprises:
 a substrate including a uniform index of refraction and a linearly varying thickness defined along axes parallel to the path of the beam.

10. The tunable external cavity laser of claim 1, wherein said gain medium comprises a laser diode.

11. The tunable external cavity laser of claim 1, wherein said voice coil actuator comprises:
 a voice coil responsive to an electrical signal to generate a magnetic field;
 a magnetic circuit coupled to said voice coil; and
 a controller for controlling the electrical signal to position said voice coil with respect to said magnetic circuit, and one of said magnetic circuit and said voice coil coupled to said tuning element to moveably position said tuning element in the path of the beam.

12. The tunable external cavity laser of claim 11, wherein said magnetic circuit defines an annulus at least partially surrounding said voice coil such that the electrical signal linearly positions said voice coil with respect to said magnetic circuit.

13. The tunable external cavity laser of claim 11, further comprising:
 an arcuate tuning arm with both said tuning element and one of said magnetic circuit and said voice coil affixed to said arcuate tuning arm such that the electrical signal arcuately positions said voice coil with respect to said magnetic circuit.

14. The tunable external cavity laser of claim 11, further comprising:
 a feedback circuit supplying a feedback signal to said controller and the feedback signal corresponding to at least one of a position of said tuning element and the selected wavelength of the beam; and
 wherein said controller further comprises:
  a logic for using the feedback signal to control the positioning of said tuning element to maintain the selected wavelength of the beam.

15. The tunable external cavity laser of claim 1, further comprising:
 a controller for controlling the electrical signal to position said tuning element, and said controller responsive to a feedback signal to control the positioning of said tuning element to maintain the selected wavelength; and
 a feedback circuit supplying the feedback signal to said controller and the feedback signal corresponding to at least one of a position of said tuning element and the selected wavelength of the beam.

16. The tunable external cavity laser of claim 15, wherein said feedback circuit further comprises:
 an encoder recording along a length thereof indicia corresponding to at least one of positions of said tuning element and selected wavelengths of the beam; and
 a reader for reading the indicia and outputting a feedback signal corresponding to the indicia read from said encoder and one of said encoder and said reader coupled to said tuning element.

17. The tunable external cavity laser of claim 16, wherein said encoder comprises at least one of: an optical encoder, a magnetic encoder, and an electrical encoder.

18. The tunable external cavity laser of claim 15, further comprising:
 a writer for writing the indicia to said encoder.

19. The tunable external cavity laser of claim 18, wherein said writer comprises at least one of: an optical writer, a magnetic writer, and an electrical writer.

20. A tunable external cavity laser, comprising:
 a gain medium to emit a beam;
 a tuning element moveably positioned in a path of the beam to provide feedback of a selected wavelength to the gain medium;
 an encoder recording along a length thereof indicia corresponding to at least one of positions of said tuning element and selected wavelengths of the beam;
 a reader for reading the indicia and one of said encoder and said reader coupled to said tuning element; and
 a positioner coupled to said tuning element to position said tuning element in the path of the beam to provide feedback of a selected wavelength to the gain medium to tune the tunable laser and said positioner positioning said tuning element such that the indicia read by said reader substantially corresponds with the selected wavelength.

21. The tunable external cavity laser of claim 20, wherein said encoder comprises at least one of: an optical encoder, a magnetic encoder, and an electrical encoder.

22. The tunable external cavity laser of claim 20, further comprising:
 a writer for writing the indicia to said encoder.

23. The tunable external cavity laser of claim 22, wherein said writer comprises at least one of: an optical writer, a magnetic writer, and an electrical writer.

24. A method for controlling the output wavelength of an external cavity laser, and the external cavity laser including a base, a gain medium to emit a beam, and a tuning element variably positioned in a path of the beam to provide feedback of a selected output wavelength to the gain medium to tune the external cavity laser; and the method for controlling comprising the acts of:

moving the tuning element to successive positions across a position range;

measuring a corresponding output wavelength at each of the successive positions across the position range, responsive to said moving act;

recording indications of the corresponding output wavelengths along a length of an encoding medium coupled to a selected one of the base and the tuning element responsive to said measuring act;

reading from the encoding medium the indications of the corresponding output wavelengths; and moving the tuning element to a selected position at which the indication of the corresponding output wavelength read in said act of reading corresponds with the selected wavelength.

25. The method for controlling of claim 24, further comprising the act of:

varying the optical path length of to suppress mode-hopping during tuning of the external cavity laser.

26. A tunable external cavity laser comprising:

a gain medium for emitting a beam;

a retroreflector in a path of the beam;

a first reflector and a second reflector positioned opposite and at an angle to one another in the path of the beam between the gain medium and the retroreflector to provide feedback of a selected wavelength to the gain medium to tune the laser; and a positioner for positioning at least one of said first reflector and said second reflector to vary a separation between the reflectors along the path of the beam, thereby tuning the laser.

27. The tunable external cavity laser of claim 26, wherein said positioner arcuately positions at least one of said first reflector and said second reflector within a plane intersected by the path of the beam to tune the laser.

28. The tunable external cavity laser of claim 27, wherein said first and said second reflectors are coupled to one another.

29. The tunable external cavity laser of claim 27, further comprising:

a wedge-shaped transmissive substrate with angularly opposing first and second faces coupled respectively to said first reflector and said second reflector.

30. The tunable external cavity laser of claim 27, wherein said first and said second reflectors define between them a wedge-shaped gap.

31. The tunable external cavity laser of claim 27, further comprising:

a corrective element coupled to the positioner in the path of the beam to suppress mode-hopping during tuning of the external cavity laser; and said positioner further for positioning said corrective element to vary the optical length of the laser to suppress mode-hopping during tuning of the external cavity laser.

32. The tunable external cavity laser of claim 31, wherein the corrective element further comprises:

a substrate including a uniform index of refraction and a linearly varying thickness defined along axes parallel to the path of the beam, and the substrate coupled to the positioner for positioning across the path of the beam to suppress mode-hopping during tuning of the laser amplifier.

33. The tunable external cavity laser of claim 31, wherein the corrective element further comprises:

a substrate including a graded index of refraction defined along a translation axis across the path of the beam, and the substrate coupled to the translator for translation across the path of the beam to suppress mode-hopping during tuning of the laser amplifier.

34. The tunable external cavity laser of claim 26, wherein further said first and said second reflectors are positioned to intersect the path of the beam at a tilt angle, thereby reducing spurious interference and reflections of the beam.

35. The tunable external cavity laser of claim 26, wherein said positioner linearly positions at least one of said first reflector and said second reflector within a plane intersected by the path of the beam to tune the laser.

* * * * *